(12) United States Patent
Luo et al.

(10) Patent No.: US 10,319,714 B2
(45) Date of Patent: Jun. 11, 2019

(54) DRAIN-EXTENDED METAL-OXIDE-SEMICONDUCTOR BIPOLAR SWITCH FOR ELECTRICAL OVERSTRESS PROTECTION

(71) Applicant: ANALOG DEVICES, INC., Norwood, MA (US)

(72) Inventors: Sirui Luo, Carlisle, MA (US); Javier Alejandro Salcedo, North Billerica, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 2 days.

(21) Appl. No.: 15/413,825

(22) Filed: Jan. 24, 2017

(65) Prior Publication Data

US 2018/0211951 A1 Jul. 26, 2018

(51) Int. Cl.
*H01L 27/02* (2006.01)
*H01L 29/10* (2006.01)
*H01L 29/78* (2006.01)

(52) U.S. Cl.
CPC ...... *H01L 27/0266* (2013.01); *H01L 27/0277* (2013.01); *H01L 29/1095* (2013.01); *H01L 29/7835* (2013.01)

(58) Field of Classification Search
CPC ............ H01L 27/0266; H01L 27/0277; H01L 27/0623; H01L 29/1095; H01L 29/7835
See application file for complete search history.

(56) References Cited

U.S. PATENT DOCUMENTS

| | | |
|---|---|---|
| 7,285,828 B2 | 10/2007 | Salcedo et al. |
| 7,566,914 B2 | 7/2009 | Salcedo et al. |
| 7,601,991 B2 | 10/2009 | Salcedo et al. |
| 7,910,999 B2 | 3/2011 | Lee et al. |
| 8,044,457 B2 | 10/2011 | Salcedo et al. |
| 8,222,698 B2 | 7/2012 | Salcedo et al. |

(Continued)

OTHER PUBLICATIONS

Salcedo et al., "Electrostatic Discharge Protection Framework for Mixed-Signal High Voltage CMOS Applications", IEEE International Conference on Solid-State and Integrated-Circuit Technology, 2008, 4 pages.

(Continued)

*Primary Examiner* — Phat X Cao
(74) *Attorney, Agent, or Firm* — Knobbe, Martens, Olson & Bear LLP

(57) ABSTRACT

High voltage drain-extended metal-oxide-semiconductor (DEMOS) bipolar switches for electrical overstress protection are provided. In certain configurations herein, an electrical overstress switch embodiment for providing electrical overstress protection, such as electrostatic discharge/electrical overstress (ESD/EOS) protection includes both a DEMOS device and an embedded bipolar device. The switch is implemented to achieve the advantages provided by the combined conduction of DEMOS and bipolar devices. For example, the DEMOS device provides surface conduction at the gate region for relatively fast switch device turn on and low voltage overshoot, while the bipolar device provides high current conduction during stress condition and a high holding voltage characteristics to prevent latch-up in mission critical integrated circuit applications.

20 Claims, 18 Drawing Sheets

(56) References Cited

U.S. PATENT DOCUMENTS

| | | |
|---|---|---|
| 8,320,091 B2 | 11/2012 | Salcedo et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,592,860 B2 | 11/2013 | Salcedo et al. |
| 8,610,251 B1 | 12/2013 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,723,227 B2 | 5/2014 | Salcedo et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,184,098 B2 | 11/2015 | Salcedo et al. |
| 9,275,991 B2 | 3/2016 | Salcedo et al. |
| 9,293,912 B2 | 3/2016 | Parthasarathy et al. |
| 9,478,608 B2 | 10/2016 | Salcedo et al. |
| 9,634,482 B2 | 4/2017 | Parthasarathy et al. |
| 2002/0081783 A1* | 6/2002 | Lee ............... H01L 27/0266 438/133 |
| 2006/0033163 A1* | 2/2006 | Chen ............... H01L 27/0277 257/355 |
| 2010/0327343 A1* | 12/2010 | Salcedo ............... H01L 24/05 257/328 |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |
| 2017/0256534 A1 | 9/2017 | Parthasarathy et al. |
| 2017/0317070 A1 | 11/2017 | Salcedo et al. |
| 2017/0366002 A1 | 12/2017 | Zhao et al. |
| 2018/0026440 A1 | 1/2018 | Zhao et al. |

OTHER PUBLICATIONS

Salcedo et al., "Analysis of Safe Operating Area of NLDMOS and PLDMOSs Transistors Subject to Transient Stresses," in IEEE Transactions on Electron Devices, vol. 57, No. 10, pp. 2655-2663, Oct. 2010, 9 pages.

* cited by examiner

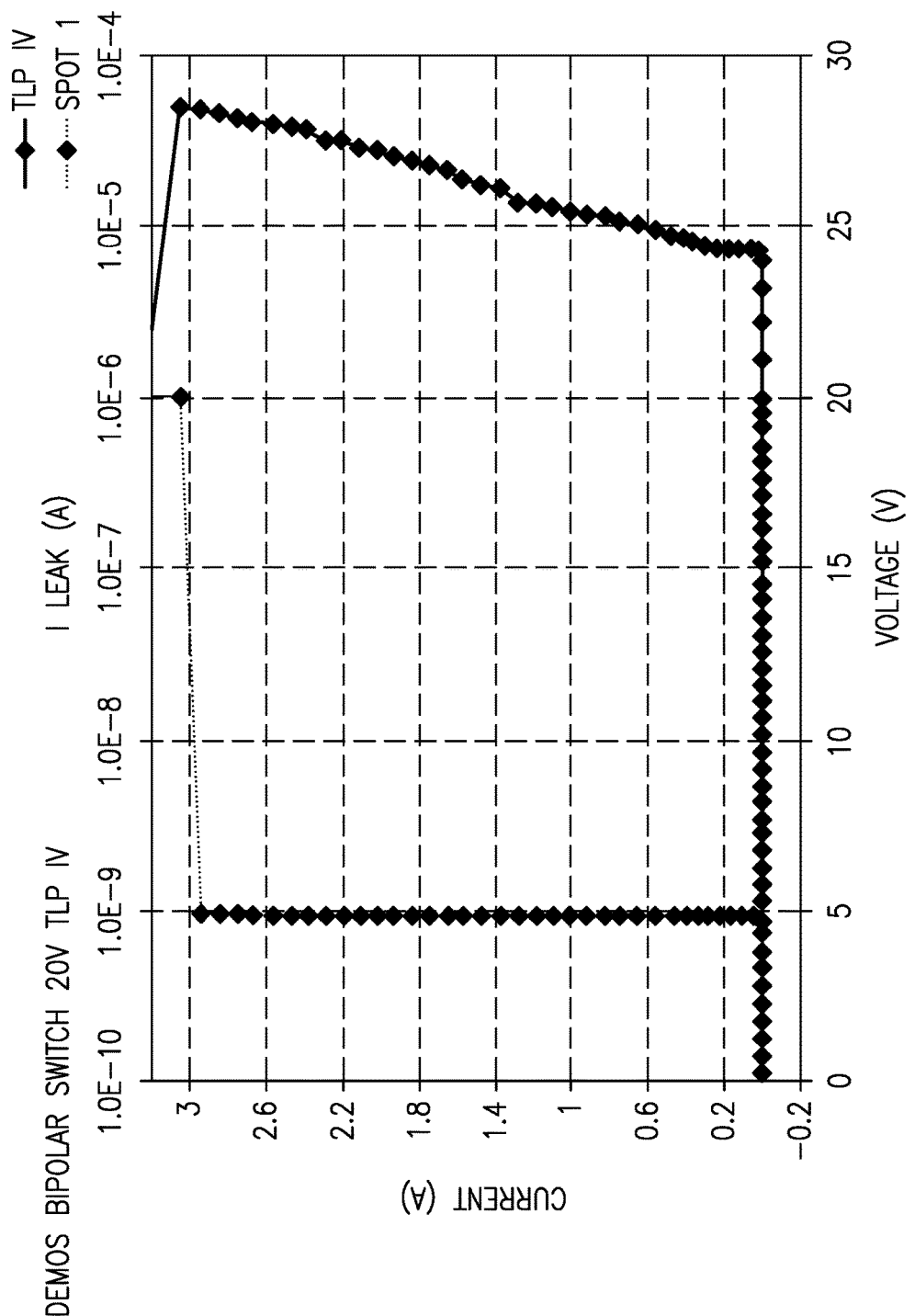

DRAIN-EXTENDED METAL-OXIDE-SEMICONDUCTOR BIPOLAR SWITCH FOR ELECTRICAL OVERSTRESS PROTECTION

FIELD OF THE DISCLOSURE

Embodiments of the invention relate to electronic systems, and more particularly, to electrical overstress protection switches for integrated circuits (ICs) interface applications.

BACKGROUND

Certain electronic systems can be exposed to a transient electrical event, or an electrical signal of a relatively short duration having rapidly changing voltage and high power. Transient electrical events can include, for example, electrostatic discharge (ESD) events and/or electromagnetic interference (EMI) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage and surface charge accumulation. Moreover, transient electrical events can induce latch-up, thereby disrupting the functioning of the IC and potentially causing permanent damage to the IC. Thus, there is a need to provide an IC with protection from such transient electrical events, such as during IC power-up and power-down conditions.

SUMMARY OF THE DISCLOSURE

High voltage drain-extended metal-oxide-semiconductor (DEMOS) bipolar switches for electrical overstress protection are provided. In certain configurations herein, an electrical overstress switch embodiment for providing electrical overstress protection, such as electrostatic discharge/electrical overstress (ESD/EOS) protection includes both a DEMOS device and an embedded bipolar device. The switch is implemented to achieve the advantages provided by the combined conduction of DEMOS and bipolar devices. For example, the DEMOS device provides surface conduction at the gate region for relatively fast switch device turn on and low voltage overshoot, while the bipolar device provides high current conduction during stress condition and a high holding voltage characteristics to prevent latch-up in mission critical integrated circuit applications.

In one aspect, an integrated circuit (IC) includes a substrate and an electrical overstress switch formed in the substrate and comprising a drain-extended metal-oxide-semiconductor (DEMOS) device and a bipolar device configured to clamp in response to an electrical overstress condition. The electrical overstress switch further includes a semiconductor region that operates as a base of the bipolar device and an active region that operates as an emitter of the bipolar device and as a source of the DEMOS device. The active region is formed in the semiconductor region and is of opposite doping type as the semiconductor region. The electrical overstress switch further includes a well that operates as a collector of the bipolar device and as a drain of the DEMOS device. The well is spaced apart from the active region in the semiconductor region, and is of common doping type as the active region. The electrical overstress switch further includes a gate region that operates as a gate of the DEMOS device, wherein the gate region is formed over the semiconductor region and extends from an edge of the active region to an edge of the well.

In another aspect, an electrical overstress switch for a high voltage interface is provided. The electrical overstress switch includes a first terminal, a second terminal, a bipolar device, and an extended-drain metal oxide semiconductor (DEMOS) device. The bipolar device includes an emitter formed from an active region, a base formed from a semiconductor region of opposite doping type as the active region, and a collector formed from a well of common doping type as the active region. The active region is electrically connected to the first terminal, and the well is electrically connected to the second terminal. The extended-drain metal oxide semiconductor (DEMOS) device includes a drain formed from the well, a source formed from the active region, a body formed from the semiconductor region, and a gate formed from a gate region. The gate region is formed over a field oxide region and the semiconductor region, and extends from an edge of the active region to an edge of the well.

In another aspect, a system-on-a-package (SoP) is provided. The SoP includes a package substrate, and a system-on-a-chip (SoC) attached to the package substrate and configured to receive a high voltage supply and ground. The SoC includes a high voltage interface circuit powered by the high voltage supply and ground, and an electrical overstress switch including an extended-drain metal oxide semiconductor (DEMOS) device and a bipolar device configured to protect the high voltage interface circuit from electrical overstress. The bipolar device includes an emitter formed from an active region, a base formed from a semiconductor region of opposite doping type as the active region, and a collector formed from a well of common doping type as the active region. The DEMOS device includes a drain formed from the well, a source formed from the active region, a body formed from the semiconductor region, and a gate formed over a field oxide region and the semiconductor region, and extending from an edge of the active region to an edge of the well.

BRIEF DESCRIPTION OF THE DRAWINGS

FIGS. 9A-9C illustrate transmission-line pulsing (TLP) data for three examples of DEMOS bipolar switches.

DETAILED DESCRIPTION

Figure 1A:
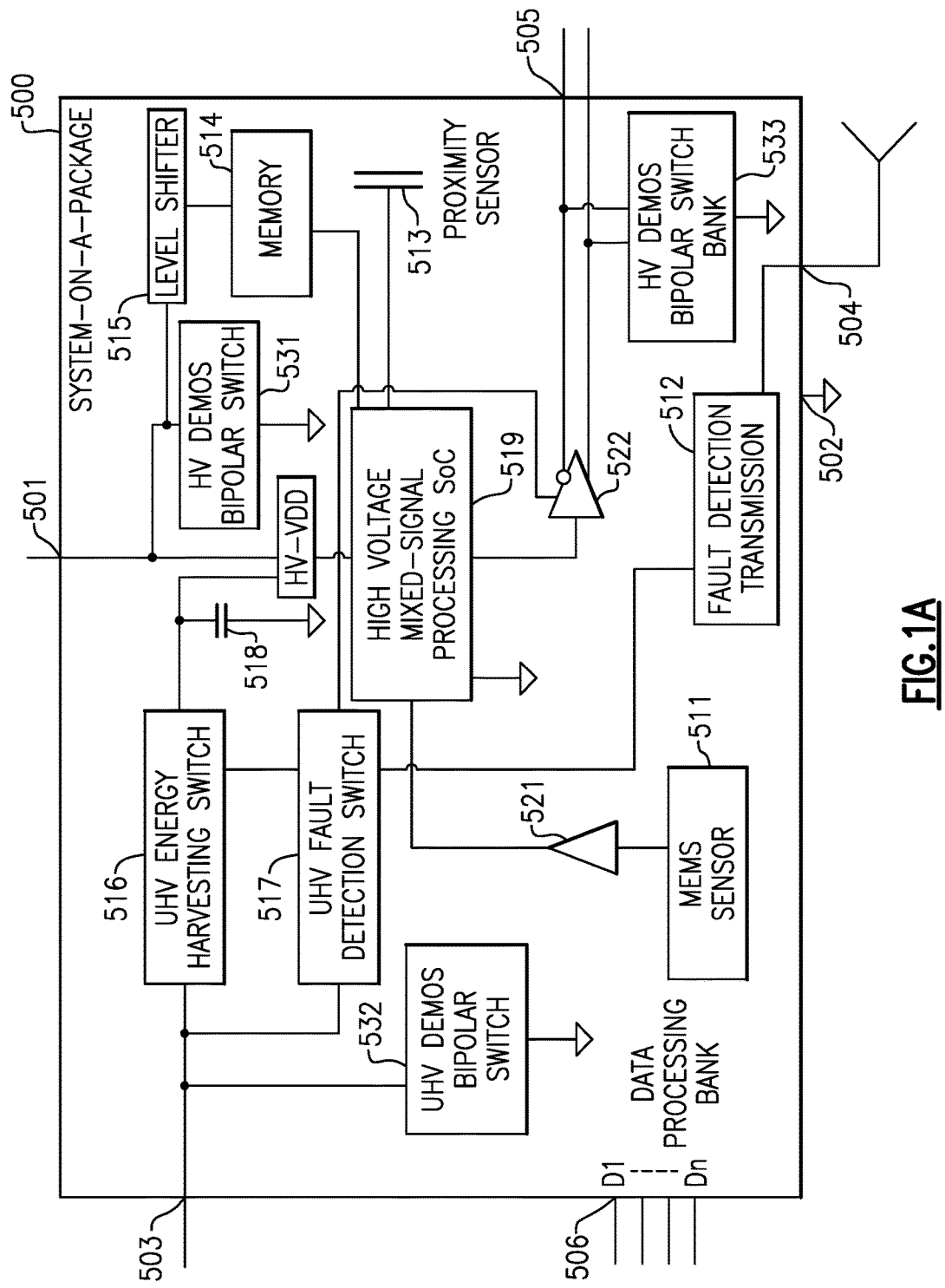
FIG. 1A is a schematic diagram of one embodiment of a system-on-a-package (SOP).

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Terms such as above, below, over and so on as used herein refer to a device orientated as shown in the figures and should be construed accordingly. It should also be appreciated that because regions within a semiconductor device (such as a transistor device) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of transient electrical events, including electrostatic discharge (ESD) events and/or electromagnetic interference (EMI) events. To meet such standards, an integrated circuit can include electrical overstress protection circuitry.

Overview of Drain-Extended Metal-Oxide-Semiconductor (DEMOS) Bipolar Switches

High voltage drain-extended metal-oxide-semiconductor (DEMOS) devices can be used to provide electrical overstress protection using relatively low cost process technologies. Using such processes can enable a competitive advantage in low and medium voltage applications, such as consumer products, instrumentation equipment, wearable electronics, power management systems, and/or other applications.

However, DEMOS devices can be sensitive to electrical overstress damage. Thus, designing an effective and fast response high voltage switches in such technologies is particularly challenging. For example, punch-through (for instance, via shallow trench isolation (STI) regions) and/or breakdown-induced damage in DEMOS devices can occur relatively quickly in the presence of stress. Accordingly, it is desirable for a DEMOS switch to respond quickly to limit overshoot voltage, maintain low standing leakage current, and sustain a high holding voltage to prevent latch-up.

To provide electrical overstress protection, either deep snapback type devices or non-snapback type devices can be used. For devices with deep snapback, the voltage drop across the device significantly decreases once the device triggers. In high voltage applications, use of deep snapback devices may be unsuitable in general, as latch-up immunity can become a concern. On the other hand, devices that do not exhibit snapback occupy a relative large chip area to handle the associated stress current, and thus substantially compromise the effectiveness and transient response of the switch.

In certain configurations herein, a switch or clamp for providing electrical overstress protection, such as ESD protection, includes both a DEMOS device and an embedded bipolar device. The switch is implemented to achieve the combined advantages provided by DEMOS and bipolar devices. For example, the DEMOS device provides surface conduction at the gate region for relatively fast device turn on and low voltage overshoot, while the bipolar device provides high holding voltage characteristics.

Furthermore, in certain configurations the gate of the DEMOS device is actively controlled by an active control circuit to achieve dynamic response characteristics over desired operating conditions.

The electrical overstress switch can include native high voltage DEMOS implants and can be implemented in a geometric array to achieve a target high blocking voltage above the normal operating voltage but below the DEMOS breakdown voltage. Since this design window can be relatively narrow, the electrical overstress switch can be implemented with low on-state resistance to provide relatively low overshoot.

In addition to providing suitable characteristic for high voltage input/output (IO) protection, the electrical overstress protection clamps or switches herein can be used to meet or exceed a narrow process design window specifications for power supply protection, since the relatively high holding voltage reduces latch-up risk and provides fast turn-on to protect even small junction structures.

Advantageously, the electrical overstress switch can also include an embedded high voltage diode device surrounding a perimeter of the DEMOS bipolar switch. In certain implementations, the DEMOS bipolar switch provides electrical overstress protection against positive stress conditions (for instance, positive polarity ESD events), while the embedded high voltage diode device provides electrical overstress protection against negative stress conditions (for instance, negative polarity ESD events). Accordingly, within a shared or common layout, the embedded high voltage diode device can provided negative stress protection with little to no impact on the positive stress high voltage switch performance.

Thus, the teachings herein can be used to address bidirectional stress conditions, including high voltage positive conduction and low forward-diode negative conduction.

In certain implementations, positive voltage electrical overstress conduction is provided by combining a p-type DEMOS (DEPMOS) device and a PNP bipolar device. For example, the PNP bipolar device can be formed using a p-type active (P+) region as emitter, an n-type well (NW) as a base, and a p-type well (PW) as a collector. In certain configurations, the P+ emitter region is connected to an emitter/source terminal of the device, and the PW includes a P+ region that is connected to a collector/drain terminal of the device. Additionally, the embedded DEPMOS is formed using a polysilicon gate, which in certain configurations extends from an edge of the P+ emitter region to an edge of the PW.

A high voltage n-type well (HVNW) can be included beneath the NW, and can include an N+ region therein to provide a base contact to the PNP bipolar device. The HVNW can be formed in a p-type substrate, and can serve to increase a resistance to the P+ emitter region. At high stress levels, the HVNW can also provide current conduction capabilities.

In certain configurations, the breakdown voltage of the device is tuned by the inclusion of the HVNW beneath the NW.

The electrical overstress switch can be implemented using multiple fingers, with each finger having this combination repeated with overlap of NW base to form a multi-finger device that achieves high protection per unit area. Thus, a number of fingers of the electrical overstress switch is scalable to provide an amount of electrical overstress protection desired for a particular application and/or implementation. For example, the number of fingers is selectable to achieve custom protection and/or loading control.

With respect to negative stress conduction, an embedded diode device can be provided. In certain implementations, a PW ring is provided around the HVNW in which the DEPMOS and PNP bipolar devices are formed. The PW ring include a P+ anode region and the HVNW can include an N+ cathode region, which can correspond to the N+ base contact region, in certain implementations. Additionally, the P+ anode region and the N+ cathode region are connected to the emitter and collector, respectively, of the PNP bipolar device via metallization. In certain configurations, the PW ring is spaced apart from the HVNW. Thus, the diode can include an anode formed from the P+ anode region, the PW ring, and the p-type substrate, and a cathode formed from the HVNW and the N+ cathode region. To enhance diode conductivity and reduce the diode's on-state resistance, the PW ring can be implemented to be shallower and of higher doping concentration relative to the PW that serves as a base of the PNP bipolar device.

Since the PW ring can be implemented to surround or encircle the HVNW, the embedded diode device can also surround the DEPMOS PNP switch, thereby providing very high conductivity for negative conduction without compromising positive conduction.

Accordingly, a high voltage DEMOS PNP switch with fast activation control can be provided. The high voltage DEMOS PNP switch includes a gate associated with an extended field oxide buffer region to accelerate switch turn-on while sustaining relatively high operating voltage and robust reliability. Thus, rapid activation is provided, while the PNP bipolar device can activate in response to stress to protect sensitive high voltage devices to electrical overstress conditions.

In one example, the switch is implemented to provide a high holding voltage of at least about 30 V, while sustaining at least about a 2,000 V human body model (HBM) electrical overstress event and occupying a device area of less than about 2,000 μm².

The DEMOS bipolar switches herein can be fabricated in a variety of manufacturing processes, including, but not limited to, CMOS processes, high voltage DMOS processes, high voltage junction-isolated BCD (Bipolar-CMOS-DMOS), and silicon on insulator (SOI) processes.

FIG. 1A is a schematic diagram of one embodiment of a system-on-a-package (SoP) 500. The SoP 500 is formed on a package substrate, and includes a high voltage (HV) supply pin 501, a ground pin 502, an ultra-high voltage (UHV) supply pin 503, a transmission pin 504, a pair of data output pins 505, data input pins 506, a microelectromechanical system (MEMS) sensor 511, a fault detection transmission circuit 512, a proximity sensor 513, a memory circuit 514, a voltage level shifter 515, an UHV energy harvesting switch 516, an UHV fault detection switch 517, an energy harvesting capacitor 518, a high voltage mixed-signal processing system-on-a-chip (SoC) 519, a buffer 521, a differential output driver 522, a HV DEMOS bipolar clamp or switch 531, an UHV DEMOS bipolar switch 532, and a HV DEMOS bipolar switch bank 533.

Although not illustrated in FIG. 1A, the SoP 500 can include more or fewer components, pins, and/or other structures, and/or can be arranged in other ways. Accordingly, other implementations are possible.

As shown in FIG. 1A, certain package pins of the SoP 500 can be protected using DEMOS bipolar switches implemented in accordance with one or more of the teachings herein. For example, the HV DEMOS bipolar switch 531 provides electrical overstress protection between the HV supply pin 501 and the ground pin 502. Additionally, the UHV DEMOS bipolar switch 532 provides protection between the UHV supply pin 503 and the ground pin 502. Furthermore, the HV DEMOS bipolar switch bank 533 includes a first HV DEMOS bipolar switch that provides protection between a first pin of the pair of data output pins 505 and the ground pin 502, and a second HV DEMOS bipolar switch that provides protection between a second pin of the pair of data output pins 505 and the ground pin 502.

Although the illustrated embodiment includes a specific number and configuration of DEMOS bipolar switches, an SoP can be protected using more or fewer DEMOS bipolar switches and/or a different configuration of DEMOS bipolar switches. For example, more or fewer and/or a different combination of package interface pins can include DEMOS bipolar switches.

High voltage circuitry refers to circuitry that operates at a higher voltage than low voltage circuitry, and ultra-high voltage circuitry refers to circuitry that operates at a higher voltage than high voltage circuitry. In one specific example, a low voltage circuit operates with a voltage of less than about 5 V, a high voltage circuit operates with a voltage in the range of about 8 V to about 30 V, and an ultra-high voltage circuit operates with a voltage that is a factor of about 1.5 to 3 times that of the high voltage circuit. Although one specific example of low voltage, high voltage, and ultra-high voltage has been provided, other voltage ranges and values are possible, such as voltages that depend on transistor gate oxide capabilities and/or breakdown voltages associated with a particular manufacturing process.

The illustrated DEMOS bipolar switches can be integrated into the SoP 500 in a variety of ways. In one example, a stand-alone die includes an array of DEMOS bipolar switches used to protect various package pins of the SoP 500. In another example, one or more DEMOS HV switches are integrated on-chip with other components of the SoP 500. For instance, the HV DEMOS bipolar switch 531 can be integrated on-chip with the high voltage mixed-signal processing SoC 519 and protect circuitry thereon and/or circuitry external to the SoC 519.

Although the SoP 500 illustrates one example of an electronic system that can include an I/O interface protected using DEMOS bipolar switches, a wide variety of I/O interfaces can be protected using DEMOS bipolar switches. Accordingly, other implementations are possible.

Figure 1B:
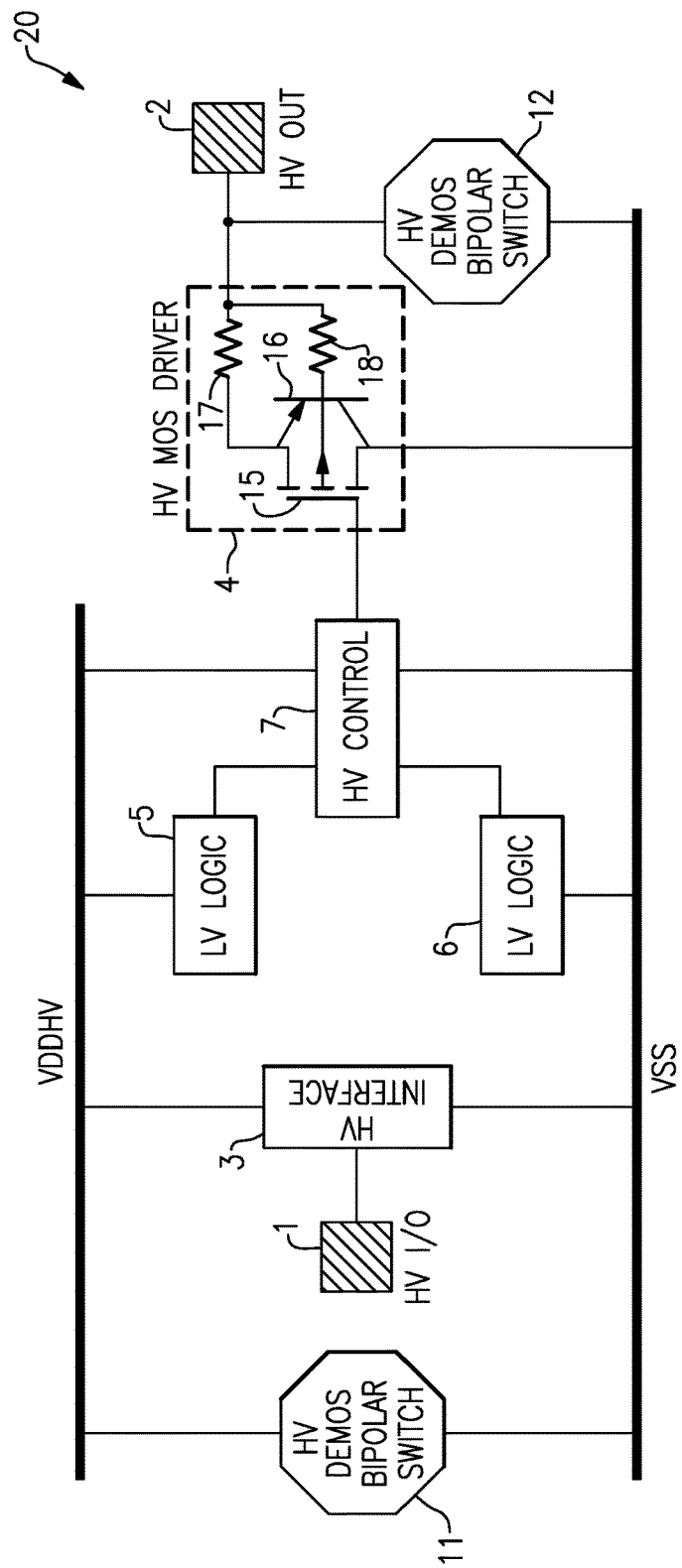
FIG. 1B is a schematic diagram of one embodiment of a high voltage input/output (IO) interface of an integrated circuit.

FIG. 1B is a schematic diagram of one embodiment of a high voltage I/O interface 20 of an integrated circuit. The high voltage I/O interface 20 includes a HV I/O pin 1, a HV output pin 2, a HV interface circuit 3, a HV MOS driver 4, a first low voltage (LV) logic circuit 5, a second LV logic circuit 6, a HV control circuit 7, a first HV DEMOS bipolar switch 11, and a second HV DEMOS bipolar switch 12.

The HV I/O interface 20 of FIG. 1B illustrates one example of an interface for an IC that can include one or more DEMOS bipolar switches implemented in accordance with the teachings herein. However, the teachings herein are applicable to other I/O interfaces.

Thus, although FIG. 1B illustrates the HV I/O interface 20 as including certain components and pins, the HV I/O interface 20 can include other implementations of circuitry. For example, the HV I/O interface 20 can include more or fewer components, pins, and/or other structures, and/or can be arranged in other ways. Accordingly, other implementations are possible.

In the illustrated embodiment, the HV interface circuit 3 is electrically connected between a high voltage supply VDDHV and ground VSS, and can be used to receive and/or send signals over the HV I/O pin 1, depending on implementation. The first HV DEMOS bipolar switch 11 includes an emitter/source terminal connected to the high voltage supply VDDHV and a collector/drain terminal connected to ground VSS, and serves to protect the HV interface circuit 3 and/or other circuitry of the HV I/O interface 20. In one embodiment, the HV I/O interface 20 is implemented on the SoC 529 FIG. 1A, and the HV interface circuit 3 is used to handle at least one sensor signal from one or more sensors of the SoP 500.

The HV MOS driver circuit 4 is electrically connected between the HV output pin 2 and ground VSS, and is controlled by the HV control circuit 7. The HV MOS driver circuit 4 includes a MOS driver transistor 15, a drain resistor 17, a body resistor 18, and a parasitic PNP bipolar transistor 16.

As shown in FIG. 1B, the source of the MOS driver transistor 15 is connected to ground VSS, a drain of the MOS driver transistor 15 is connected to the HV output pin 2 via the drain resistor 17, and a body of the MOS driver transistor 15 is connected to the HV output pin 2 via the body resistor 18. Additionally, a gate of the MOS driver transistor 15 is controlled by the HV control circuit 7 based on signals received from the first LV logic circuit 5 and/or the second LV logic circuit 6.

The second HV DEMOS bipolar switch 12 includes an emitter/source terminal connected to the HV output pin 2 and a collector/drain terminal connected to ground VSS, and serves to protect the HV MOS driver 4 from damage from electrical overstress. For example, the second HV DEMOS bipolar switch 12 can protect junctions of the parasitic PNP bipolar transistor 16 from damage.

Figure 2A:
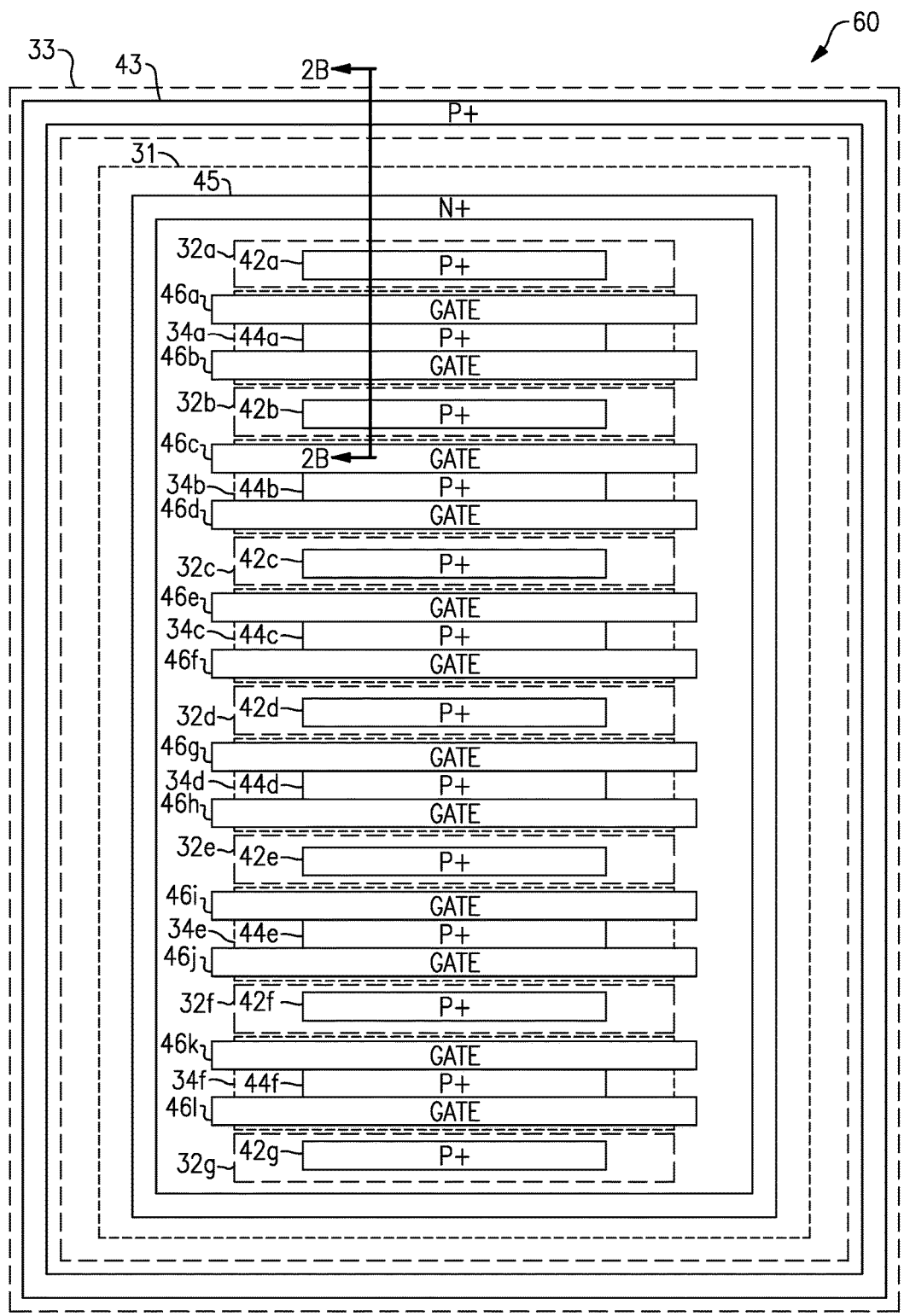
FIG. 2A is a top plan view of a drain-extended metal-oxide-semiconductor (DEMOS) bipolar switch according to one embodiment.
Figure 2B:
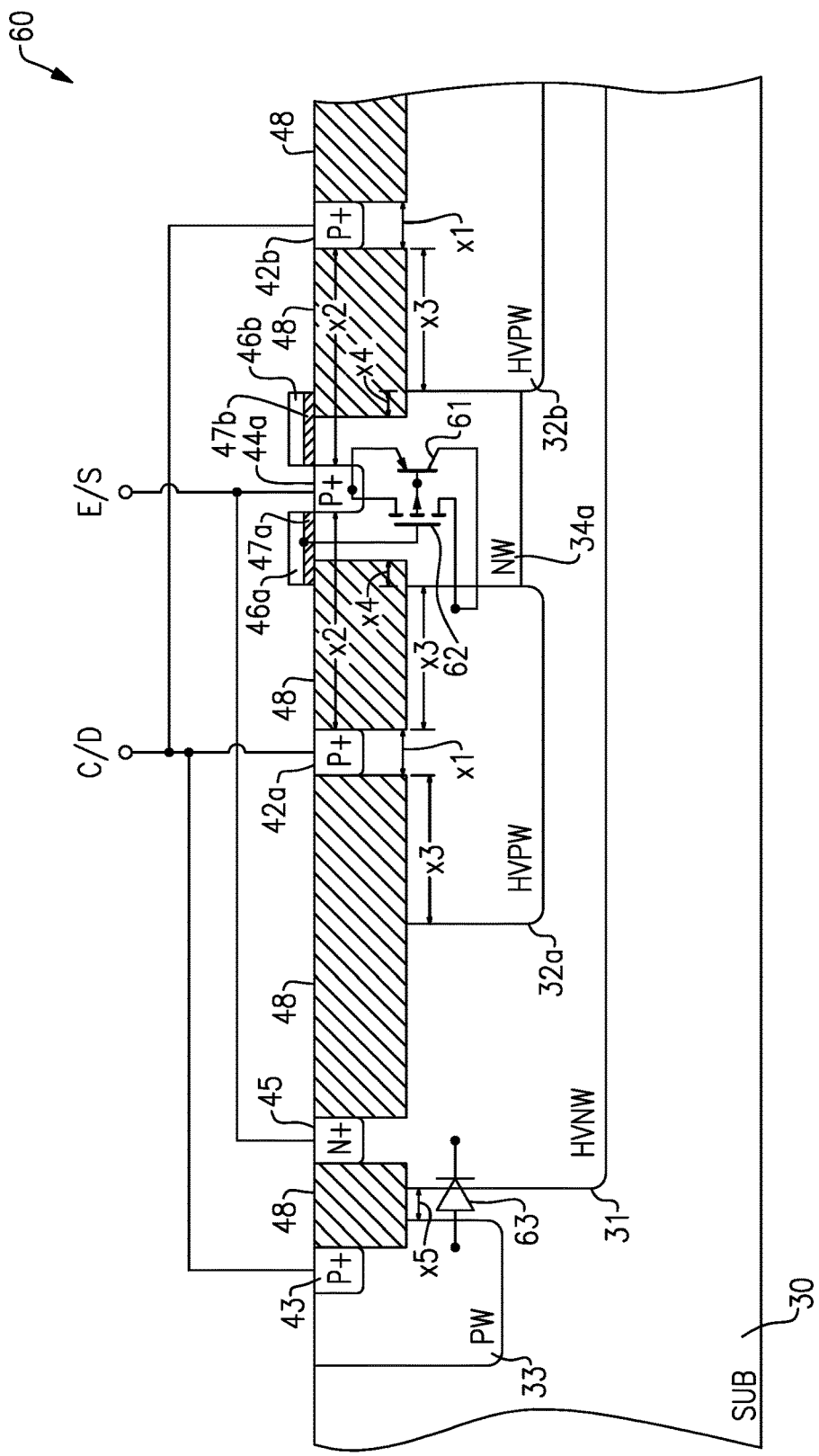
FIG. 2B is an annotated cross-section of the DEMOS bipolar switch of FIG. 2A taken along the lines 2B-2B of FIG. 2A.

FIG. 2A is a top plan view of a DEMOS bipolar switch or clamp 60 according to one embodiment. FIG. 2B is an annotated cross-section of the DEMOS bipolar switch 60 of FIG. 2A taken along the lines 2B-2B of FIG. 2A. Although a specific implementation of a DEMOS bipolar switch is shown in FIGS. 2A and 2B, the teachings herein are applicable to DEMOS bipolar switches implemented in a wide variety of ways.

The illustrated DEMOS bipolar switch 60 of FIGS. 2A and 2B is fabricated in a p-type substrate (SUB) 30, and includes a high voltage n-type well (HVNW) 31, first to seventh high voltage p-type wells (HVPWs) 32a-32g, respectively, a p-type well (PW) ring 33, first to sixth n-type wells (NWs) 34a-34f, respectively, first to seventh collector/drain p-type active (P+) regions 42a-42g, respectively, a P+ ring 43, first to sixth emitter/source P+ regions 44a-44f, respectively, an n-type active (N+) ring 45, first to twelfth gate regions 46a-46l, respectively, and field oxide regions 48.

For purposes of figure clarity, the field oxide regions 48 and metallization are not shown in the top plan view of FIG. 2A.

Although the DEMOS bipolar switch 60 of FIGS. 2A and 2B illustrates one example of a DEMOS bipolar switch implemented in accordance with the teachings herein, a DEMOS bipolar switch can be implemented in a wide variety of ways, including, but not limited to, using different configurations of semiconductor wells, active regions, and/or gate regions. Accordingly, the teachings herein are applicable to other implementations of DEMOS bipolar switches.

In the illustrated embodiment, the DEMOS bipolar switch 60 is implemented using 12 device fingers, each associated with one of the gate regions 46a-46l. However, a number of device fingers can be scaled to provide an amount of electrical overstress protection desired for a particular application and/or implementation. In one embodiment, a DEMOS bipolar switch includes a number of device fingers in the range of 1 to 30.

As shown in FIG. 2A, the PW ring 33 and the HVNW 31 are formed in the SUB 30. Additionally, the PW ring 33 surrounds or encircles a perimeter of the HVNW 31 and is spaced apart therefrom, in this embodiment. The P+ ring 43 is formed in the PW ring 33, and is electrically connected to a collector/drain (C/D) terminal of the switch 60 via metallization.

The N+ ring 45 is formed in the HVNW 31, and is implemented as a ring along a perimeter of the HVNW 31. Additionally, the N+ ring 45 is electrically connected to an emitter/source (E/S) terminal via metallization.

The HVPWs 32a-32g and the NWs 34a-34f are formed in the HVNW 31. Additionally, each of the NWs 34a-34f is positioned between a corresponding pair of the HVPWs 32a-32g. For example, the first NW 34a is positioned between the first HVPW 32a and the second HVPW 32b, and the second NW 34b is positioned between the second HVPW 32b and the third HVPW 32c.

In the illustrated embodiment, the first to seventh collector/drain P+ regions 42a-42g are formed in the first to seventh HVPWs 32a-32g, respectively. Additionally, each of the first to seventh collector/drain P+ regions 42a-42g is electrically connected to the C/D terminal via metallization. The first to sixth emitter/source P+ regions 44a-44f are formed in the first to sixth NWs 34a-34f, respectively. Additionally, each of the first to sixth emitter/source P+ regions 44a-44f is electrically connected to the E/S terminal via metallization.

The electrical connections to the E/S terminal and the C/D terminal are schematically depicted in FIG. 2B, and can correspond to electrical connections made using contacts and metallization during back end processing. The E/S terminal can also be referred to herein as a first terminal of the switch 60, and the C/D terminal can also be referred to herein as a second terminal of the switch 60.

In the illustrated embodiment, the first to twelfth gate regions 46a-46l are each formed over one of the NWs 34a-34f, and each of the gate regions 46a-46l includes a first gate edge aligned with an edge on one of the emitter/source P+ regions 44a-44f, and a second gate edge aligned with one of the HVPWs 32a-32g. Although FIG. 2B illustrates exact alignment between the gate edges and the doped regions, persons having ordinary skill in the art will appreciate that the doped regions diffuse (for instance, beneath the gate regions) during thermal processing.

As shown in FIG. 2B, the first gate region 46a is formed over the first NW 34a, and includes a first gate edge aligned with a first edge of the first emitter/source P+ region 44a, and a second gate edge aligned with an edge of the first HVPW 32a. Additionally, the second gate region 46b is formed over the first NW 34a, and includes a first gate edge aligned with a second edge of the first emitter/source P+ region 44a, and a second gate edge aligned with an edge of the second HVPW 32b. As shown in FIG. 2B, a field oxide region 48 is positioned under a portion of each of the gate regions 46a-46l, and along with a thin oxide region (for instance, thin oxide regions 47a and 47b) forms part of a gate oxide layer associated with each gate region.

Thus, in the illustrated embodiment, the gate oxide layer associate with each of the gate regions 46a-46l is thicker near the drain relative to the source. In particular, a thickness of the gate oxide layer near the source corresponds a thickness of the thin oxide region (for instance, thin oxide regions 47a and 47b), while a thickness of the gate oxide layer near the drain corresponding to a combined thickness of the field oxide region and the thin oxide region.

Although not illustrated in FIGS. 2A and 2B, the SUB 30 can also include other devices or structures formed therein.

As shown in FIG. 2B, the HVPWs 32a-32g have a depth into the SUB 30 that is greater than a depth into SUB 30 than the PW ring 33. Additionally, the HVNW 31 has a depth into the SUB 30 that is greater than a depth into the SUB 30 of both the NWs 34a-34f and the HVPWs 32a-32g. Additionally, the illustrated semiconductor wells have a depth into the SUB 30 that is greater than a depth of the N+ and P+ regions. Furthermore, the field oxide regions 48 have a depth into the SUB 30 that is greater than a depth of the N+ and P+ regions, but less than a depth of the semiconductor wells.

In the illustrated embodiment, the N+ ring 45 has a higher n-type doping concentration than the NWs 34a-34f, which in turn have a higher n-type doping concentration than the HVNW 31. Additionally, the P+ regions have a higher p-type doping concentration than the PW ring 33, which in turn has a higher p-type doping concentration than the HVPWs 32a-32g, which in turn have a higher p-type doping concentration than the SUB 30.

As shown in FIG. 2A, the HVPWs 32a-32g, the NWs 34a-34f, the collector/drain P+ regions 42a-42g, the emitter/source P+ regions 44a-44f, and the gate regions 46a-46l extend or are elongated in a first direction (horizontally in FIG. 2A). Additionally, a current flow of the DEMOS bipolar switch in response to positive polarity stress is in a second direction (vertically in FIG. 2A).

The illustrated embodiment includes field oxide regions 48. Formation of the field oxide regions can include etching trenches in the SUB 30, filling the trenches with a dielectric, such as silicon dioxide ($SiO_2$), and removing the excess dielectric using any suitable method, such as chemical-mechanical planarization. In certain implementations, the field oxide regions correspond to shallow trench (STI) regions.

The DEMOS bipolar switch 60 of FIG. 2B has been further annotate to show certain circuit devices present in the cross-section, including a PNP bipolar device 61, an DEPMOS device 62, and a diode device 63.

The PNP bipolar device 61 includes an emitter formed by the emitter/source P+ region 44a, a collector formed by the HVPW 32a and the collector/drain P+ region 42a, and a base formed by the NW 34a, the HVNW 31, and the N+ ring 45. As shown in FIG. 2B, the emitter and base of the PNP bipolar device 61 are electrically connected to the E/S terminal, and the collector of the PNP bipolar device 61 is electrically connected to the C/D terminal.

The DEPMOS device 62 includes a gate formed by the gate region 46a, a source formed by the emitter/source P+ region 44a, a drain formed by the HVPW 32a and the collector/drain P+ region 42a, and a body formed by the NW 34a, the HVNW 31, and the N+ ring 45. As shown in FIG. 2B, the source and body of the of the DEPMOS device 62 are electrically connected to the E/S terminal, and the drain of the DEPMOS device 62 is electrically connected to the C/D terminal.

The gate of the DEPMOS device 62 can be, for example, controlled dynamically by a gate control circuit (see, for example, FIGS. 4A and 4B), biased by a DC voltage, or electrically floating.

Although FIG. 2B has been annotated to show devices associated with one finger (corresponding to the finger that includes the gate region 46a), the DEMOS bipolar switch 60 includes a corresponding DEPMOS device and PNP bipolar device associated with each finger.

The diode device 63 includes an anode formed by the P+ ring 43, the PW ring 33, and the SUB 30, and a cathode formed by the HVNW 31 and N+ ring 45. As shown in FIG. 2B, the anode of the diode device 63 is electrically connected to the C/D terminal, and the cathode of the diode device 63 is electrically connected to the E/S terminal.

During normal operating conditions between the E/S terminal and the C/D terminal, the DEMOS bipolar switch 60 should be turned off and not conduct between the E/S terminal and the C/D terminal.

However, when the voltage of the E/S terminal is greater than the C/D terminal by a forward trigger voltage of the switch 60, the embedded DEPMOS and PNP bipolar devices active to provide electrical overstress protection. Additionally, the switch 60 operates with the combined benefits of the DEMOS and PNP bipolar devices, including surface conduction beneath the gate regions 46a-46l to provide relatively fast device turn on and low voltage overshoot, and high holding voltage characteristics.

Additionally, when the voltage of the E/S terminal is less than the C/D terminal by a reverse trigger voltage of the switch 60, the diode device 63 turns on to provide electrical overstress protection. The diode device 63 surrounds a perimeter of HVNW 31 in which DEPMOS and PNP bipolar devices are formed, and thus provides high current handling capability and low on state resistance for reverse protection.

Accordingly, the DEPMOS and PNP bipolar devices provide electrical overstress protection against positive stress conditions (for instance, positive polarity ESD events), while the embedded diode device 63 provides electrical overstress protection against negative stress conditions (for instance, negative polarity ESD events). Accordingly, within a shared or common layout, the diode device 63 provides negative stress protection with little to no impact on the positive stress high voltage switch performance provided by DEPMOS and PNP bipolar devices.

The DEMOS bipolar switch 60 of FIGS. 2A and 2B can be used to provide electrical overstress protection a wide variety of electronic systems, such as the SoP 500 of FIG. 1A and/or the I/O interface 20 of FIG. 1B. Although two example systems in which one or more DEMOS bipolar switches can be included have been provided, DEMOS bipolar switches can be used to provide electrical overstress protection in a wide variety of electronic systems.

As shown in FIG. 2B, certain dimensions of the DEMOS bipolar switch 60 have been annotated in FIG. 2B, including a first dimension x1, a second dimension x2, a third dimension x3, a fourth dimension x4, and a fifth dimension x5.

The first dimension x1 corresponds to a width of the collector/drain P+ regions 42a-42g. In certain implementations, a width of the emitter/source P+ regions 44a-44f is selected to be similar or equal to the first dimension x1. The value of the first dimension x1 can be selected to control a trade-off between clamp layout area and current conduction capability.

With continuing reference to FIG. 2B, the second dimension x2 corresponds to a spacing distance between a collector/drain P+ region and an adjacent emitter/source P+ region. The value of the second dimension x2 can be selected to help achieve blocking voltage characteristics desirable for a particular application or set of operating conditions.

The third dimension x3 corresponds to a distance between an edge of a gate region and an edge of an adjacent collector/drain P+ region. The value of the third dimension x3 can control an DEPMOS device drain length, thereby controlling blocking voltage characteristics of the switch as well as switch leakage current.

With continuing reference to FIG. 2B, the fourth dimension x4 corresponds to a width of oxide beneath a gate region. The value of the fourth dimension x4 can be selected to control leakage current of the switch.

The fifth dimension x5 corresponds to a spacing between the PW ring 33 and the HVNW 31. The value of the fifth dimension x5 can control a blocking voltage from cathode to anode of the diode device 63, thereby controlling reverse protection characteristics.

In the illustrated embodiment, the device fingers of the DEMOS bipolar switch 60 are substantially identical to one another. For example, with respect to the two device fingers shown in FIG. 2B, the dimensions x1, x2, x3, and x4 are the same for each device finger. However, other implementations are possible.

One implementation of switch area, number of fingers, and values for the dimensions x1, x2, x3, x4, and x5 are given by Table 1 below. The values correspond to one example implementation of an electrical overstress switch for protecting NDMOS transistors specified for about 21 V operation with a 1.2 V threshold voltage and a drain-to-source breakdown voltage (BVDSS) of about 28 V, and for protecting PDMOS transistors specified for about 21 V operation with a −0.8 V threshold voltage and a BVDSS of about 28 V. With respect to the orientation shown in FIG. 2A, area is expressed in Table 1 as a horizontal width of the layout, followed by a vertical width of the layout. Although one example of values has been provided, the teachings herein are applicable to a wide variety of implementations.

TABLE 1

| Parameter | Example Value |
| --- | --- |
| x1 | 0.5 μm |
| x2 | 1.0 μm |
| x3 | 0.5 μm |
| x4 | 0.1 μm |
| x5 | 2.5 μm |
| Area | 185 μm × 106 μm |
| Number of Fingers | 24 |

Figure 3:
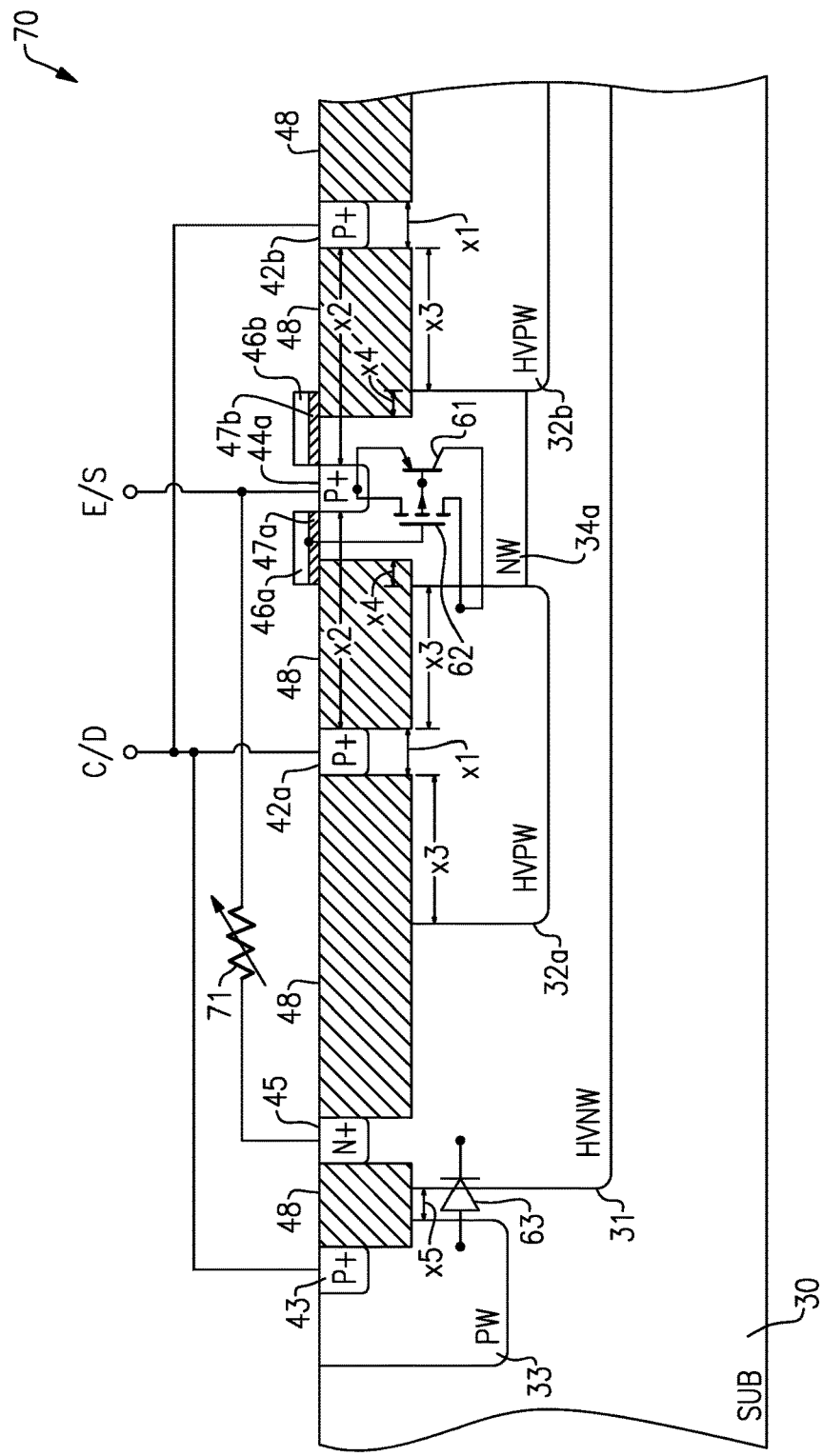
FIG. 3 is an annotated cross-section of a DEMOS bipolar switch according to another embodiment.

FIG. 3 is an annotated cross-section of a DEMOS bipolar switch 70 according to another embodiment. The DEMOS bipolar switch 70 of FIG. 3 is similar to the DEMOS bipolar switch 60 of FIGS. 2A and 2B, except that the DEMOS bipolar switch 70 of FIG. 3 further includes a variable resistor 71.

As used herein, a "variable" component includes components having controllable value, including, but not limited to analog-tuned components and/or digitally-tuned components, such as digitally programmable components.

As shown in FIG. 3, the variable resistor 71 is electrically connected between the N+ ring 45 and the emitter/source terminal. The variable resistor 71 can be used to provide control over a forward trigger voltage. For example, increasing an amount of resistance of the variable resistor 71 also increases an amount of resistance across the base-to-emitter junction of the PNP bipolar device 61. Accordingly, the variable resistor 71 can be used to tune forward trigger voltage from a higher forward trigger voltage associated with the base and emitter shorted to a lower forward trigger voltage with resistance present between the base and emitter.

Accordingly, a manufacturer, supplier, and/or user can control the operational performance of the switch 70 by controlling a resistance value of the variable resistor 71.

The variable resistor 71 can have a resistance controlled in a wide variety of ways. In one example, the variable resistor 71 can include multiple paths that each including a resistance element and a selection element. Additionally, one or more of the resistance elements can be selected, for instance, using fuses and/or anti-fuses, to control an amount of resistance provided by the variable resistor 71. In another example, the variable resistor 71 is implemented using a trimmed resistor.

Although FIG. 3 illustrates an embodiment in which a variable resistor is included between the N+ ring and the emitter/source terminal, the teachings herein are also applicable to implementations including a fixed resistor. For example, in one implementation, a fixed resistor with a resistance in the range of about 10Ω to about 100Ω is provided.

In FIG. 3, the variable resistor 71 is depicted in schematic form above the SUB 30. However, persons having ordinary skill in the art will appreciate that the variable resistor 71 can be fabricated in the SUB 30, for instance, in a portion of the SUB 30 that is not visible in the cross-section of FIG. 3.

Figure 4A:
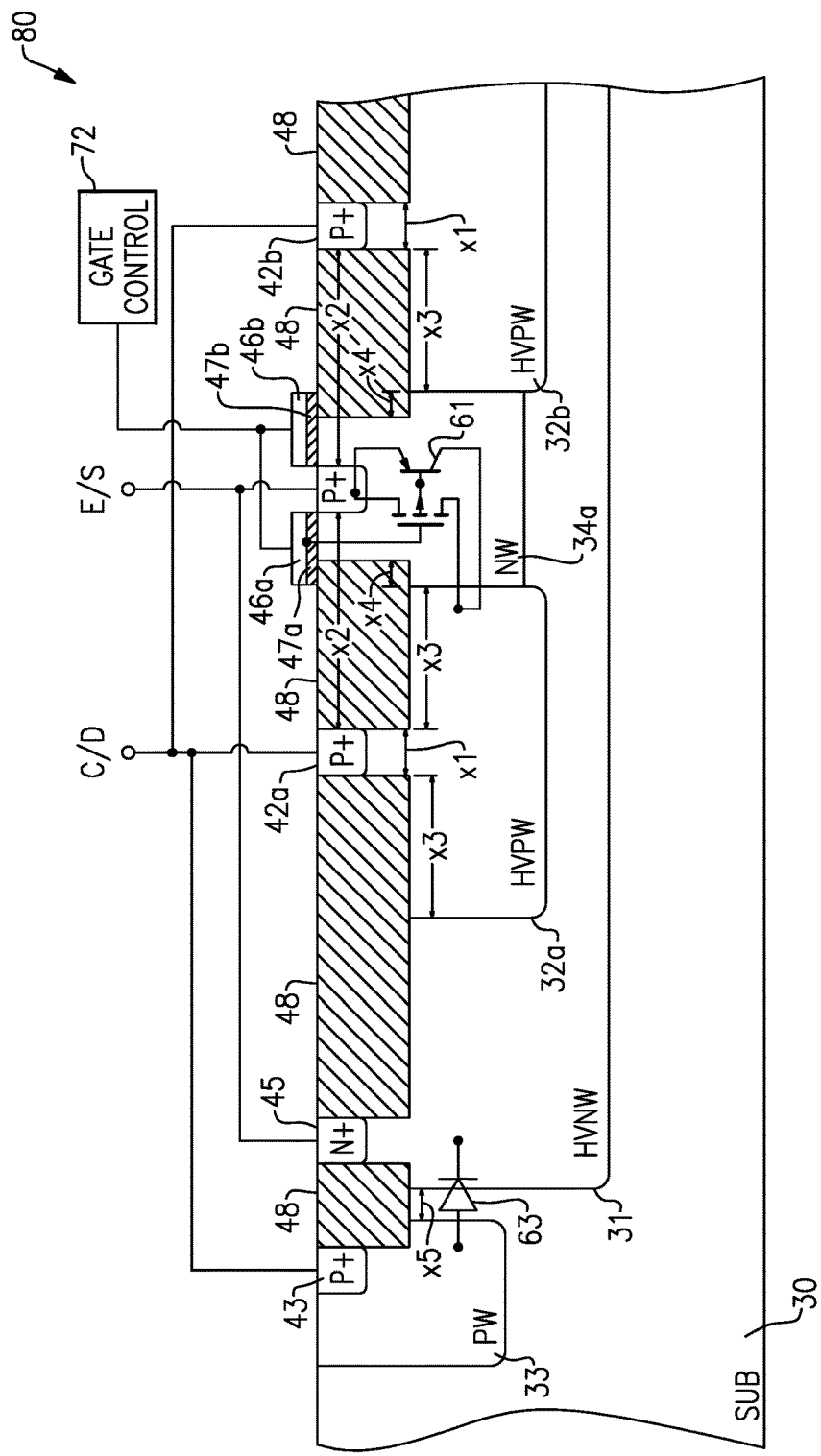
FIG. 4A is an annotated cross-section of a DEMOS bipolar switch according to another embodiment.

FIG. 4A is an annotated cross-section of a DEMOS bipolar clamp or switch 80 according to another embodiment. The DEMOS bipolar switch 80 of FIG. 4A is similar to the DEMOS bipolar switch 60 of FIGS. 2A and 2B, except that the DEMOS bipolar switch 80 further includes a gate control circuit 72 configured to control the gate regions of the DEMOS bipolar switch 80.

Including the gate control circuit 72 can provide active control to the clamp's surface conduction, thereby achieving dynamic response characteristics over desired operating conditions. For example, including the gate control circuit 72 can lead to faster activation of DEMOS device components relative to an implementation in which the gate control circuit 72 is omitted.

In certain configurations, the gate control circuit 72 monitors one or more nodes to detect for presence of electrical overstress, and activates the clamp's gate regions when an electrical overstress event is detected. In certain implementations, the gate control circuit 72 detects electrical overstress by monitoring for a rapidly changing voltage occurring for a sufficient period of time. However, the gate control circuit 72 can detect for presence of electrical overstress based on a multitude of detection conditions indicative of an electrical overstress event's potential to damage sensitive electronics, including, but not limited to, observations of power, voltage, current, and/or charge.

In certain implementations, the gate control circuit 72 also controls the gate regions to a desired DC bias voltage during normal operating conditions, thereby controlling static off-state leakage performance and/or DC operating characteristics.

Figure 4B:
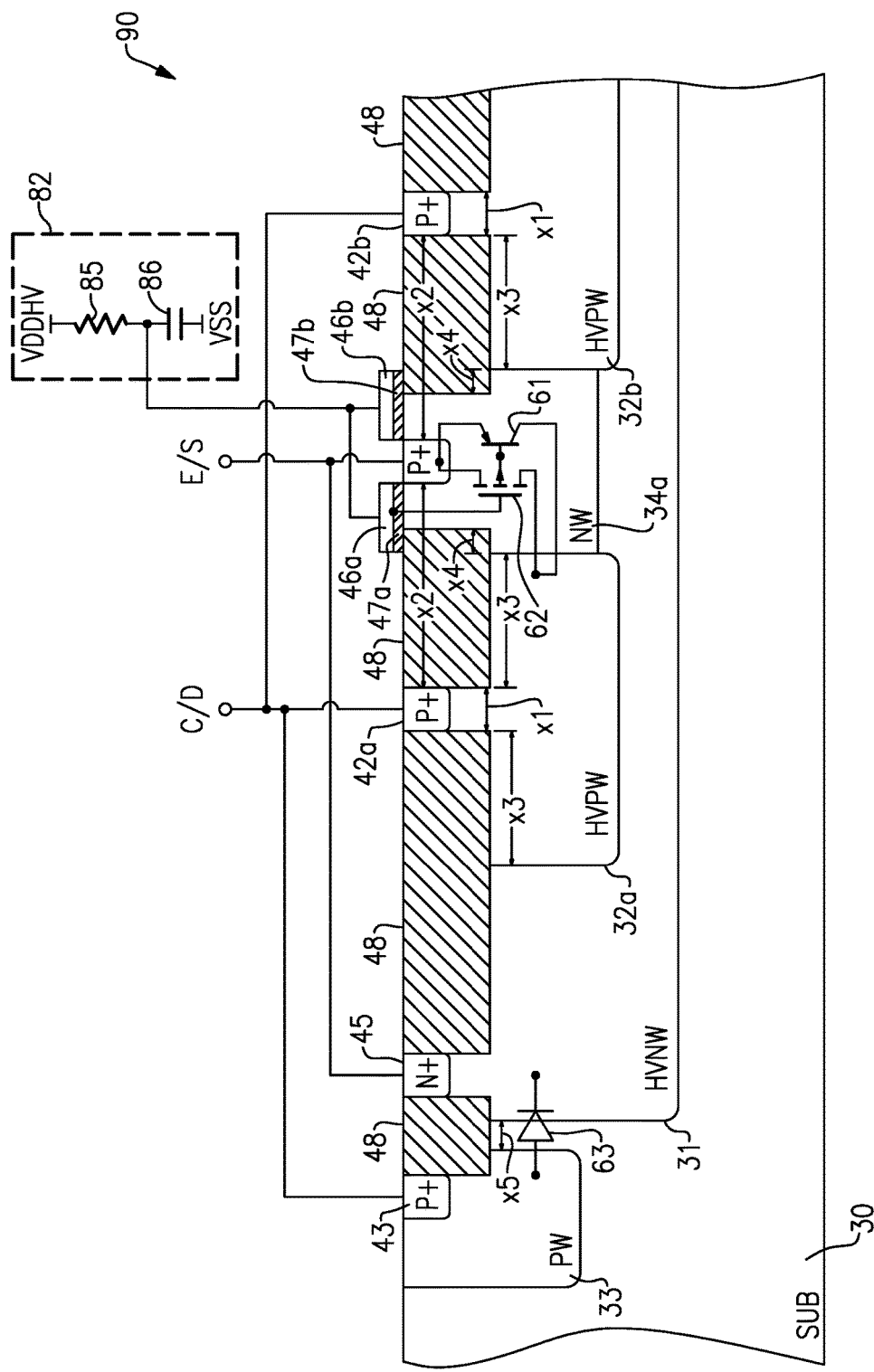
FIG. 4B is an annotated cross-section of a DEMOS bipolar switch according to another embodiment.

FIG. 4B is an annotated cross-section of a DEMOS bipolar switch or clamp 90 according to another embodiment. The DEMOS bipolar switch 90 of FIG. 4B is similar to the DEMOS bipolar switch 80 of FIG. 4A, except that the DEMOS bipolar switch 90 illustrates a specific implementation of a gate control circuit 82.

In the illustrated embodiment, the gate control circuit 82 includes a detection resistor 85 and a detection capacitor 86 electrically connected in series between a high voltage supply VDDHV and ground VSS. Additionally, an intermediate node between the detection resistor 85 and the detection capacitor 86 is used to control the gate regions of the DEMOS bipolar switch 90.

The detection capacitor 86 and the detection resistor 85 operate as a low pass filter between the high voltage supply VDDHV and ground VSS. In response to an increase of the high voltage supply VDDHV relative to ground VSS, a voltage of the clamp's gate regions is controlled to a low voltage suitable for activating the embedded DEPMOS device and providing surface conduction. After a time delay that is based on a time constant of the detection capacitor 86 and the detection resistor 85, the gate control circuit 82 turns off the DEPMOS device.

Although one example of a gate control circuit for dynamically controlled a clamp's gate regions is shown in FIG. 4B, a gate control circuit can be implemented in a wide variety of ways.

In FIG. 4B, the detection capacitor 86 and the detection resistor 85 are depicted in schematic form above the SUB 30. However, persons having ordinary skill in the art will appreciate that the detection capacitor 86 and the detection resistor 85 can be fabricated in the SUB 30, for instance, in a portion of the SUB 30 that is not visible in the cross-section of FIG. 4B.

Figure 5:
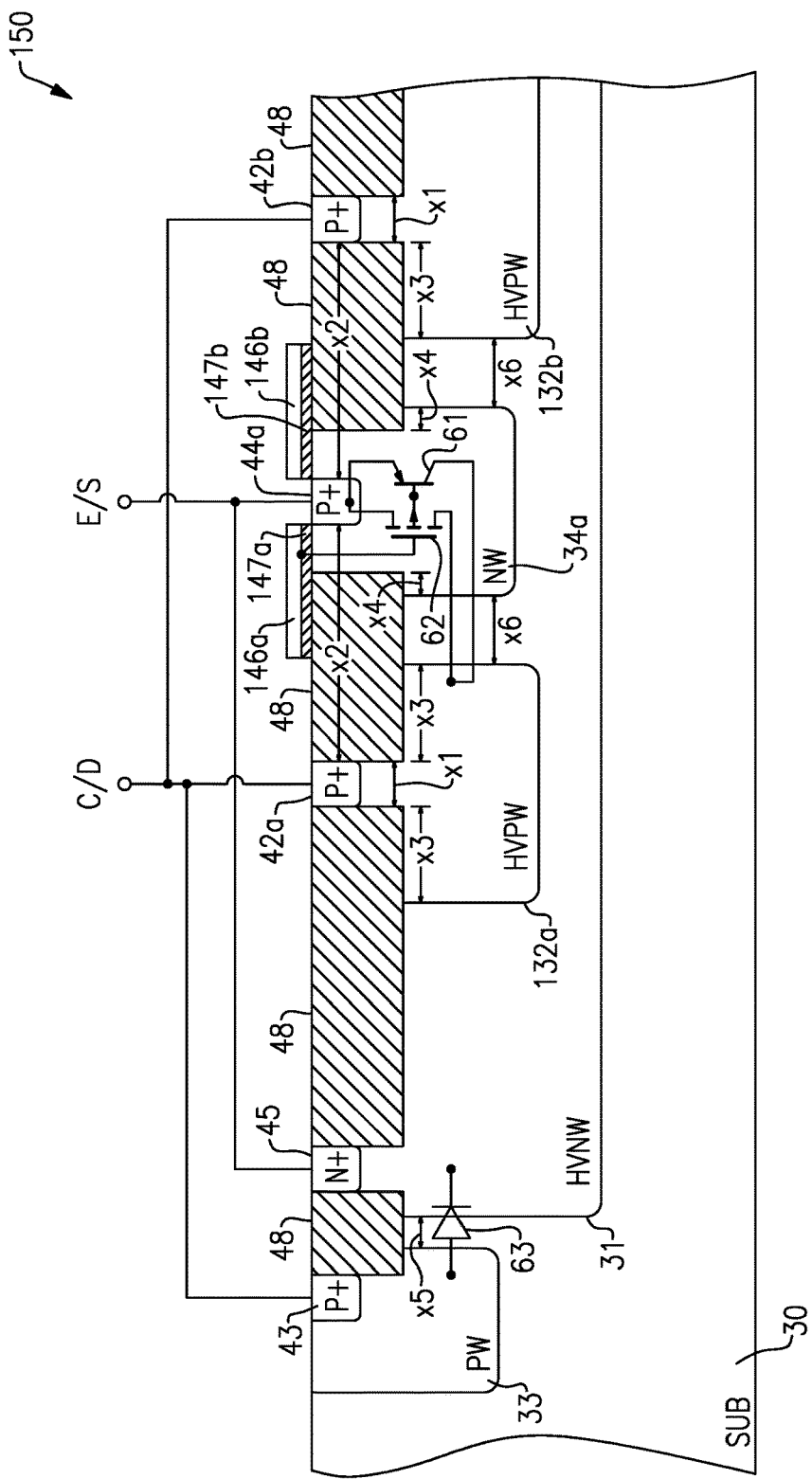
FIG. 5 is an annotated cross-section of a DEMOS bipolar switch according to another embodiment.

FIG. 5 is an annotated cross-section of a DEMOS bipolar switch or clamp 150 according to another embodiment. The DEMOS bipolar switch 150 of FIG. 5 is similar to the DEMOS bipolar switch 60 of FIGS. 2A and 2B, except that the DEMOS bipolar switch 150 includes a separation or spacing between a HVPW and an adjacent NW. Additionally, a gate region extends from a P+ emitter/source to an edge of a HVPW, including over the separation region between the HVPW and NW.

For example, as shown FIG. 5, the switch 150 includes a first HVPW 132a that is spaced apart from NW 34a, and a first gate region 146a that extends from a first edge of the emitter/source P+ region 44a to an edge of the HVPW 132a. Furthermore, the switch 150 includes a second HVPW 132b that is spaced apart from NW 34a, and a second gate region 146b that extends from a second edge of the emitter/source P+ region 44a to an edge of the HVPW 132b. As shown in FIG. 5, the first gate region 146a is formed over the thin oxide region 146a and a field oxide region 48, and the second gate region 146b is formed over the thin oxide region 146b and another field oxide region 48.

Providing a separation or spacing between HVPW and NW can increase a forward trigger voltage of the switch, thereby rendering the switch suitable for protecting devices that operate with higher nominal operating voltages.

As shown in FIG. 5, certain dimensions of the DEMOS bipolar switch 150 have been annotated in FIG. 5, including a first dimension x1, a second dimension x2, a third dimension x3, a fourth dimension x4, and a fifth dimension x5, which can be as described above. Additionally, a sixth dimension x6 has been annotated, corresponding to a separation between a HVPW and an adjacent NW. Along with certain other dimensions of the device (for instance, dimensions x2 and x3), the value of the sixth dimension x6 can be selected to achieve blocking voltage characteristics of the switch desirable for a particular application or set of operating conditions.

One implementation of switch area, number of fingers, and values for the dimensions x1, x2, x3, x4, x5, and x6 are given by Table 2 below. The values correspond to one example implementation of an electrical overstress switch for protecting NDMOS transistors specified for about 25 V operation with a 1.26 V threshold voltage and a BVDSS of about 32 V, and for protecting PDMOS transistors specified for about 25 V operation with a −0.83 V threshold voltage and a BVDSS of about 42 V. Although one example of values has been provided, the teachings herein are applicable to a wide variety of implementations.

TABLE 2

| Parameter | Example Value |
| --- | --- |
| x1 | 0.5 µm |
| x2 | 1.3 µm |
| x3 | 0.5 µm |
| x4 | 0.1 µm |
| x5 | 2.5 µm |
| x6 | 0.3 µm |
| Area | 185 µm × 120 µm |
| Number of Fingers | 24 |

Another implementation of switch area, number of fingers, and values for the dimensions x1, x2, x3, x4, x5, and x6 are given by Table 3 below. The values correspond to one example implementation of an electrical overstress switch for protecting NDMOS transistors specified for about 30 V operation with a 1.2 V threshold voltage and a BVDSS of about 37 V. Although one example of values has been provided, the teachings herein are applicable to a wide variety of implementations.

TABLE 3

| Parameter | Example Value |
| --- | --- |
| x1 | 0.5 µm |
| x2 | 1.5 µm |
| x3 | 0.5 µm |
| x4 | 0.1 µm |
| x5 | 2.5 µm |
| x6 | 0.5 µm |
| Area | 185 µm × 130 µm |
| Number of Fingers | 24 |

Figure 6:
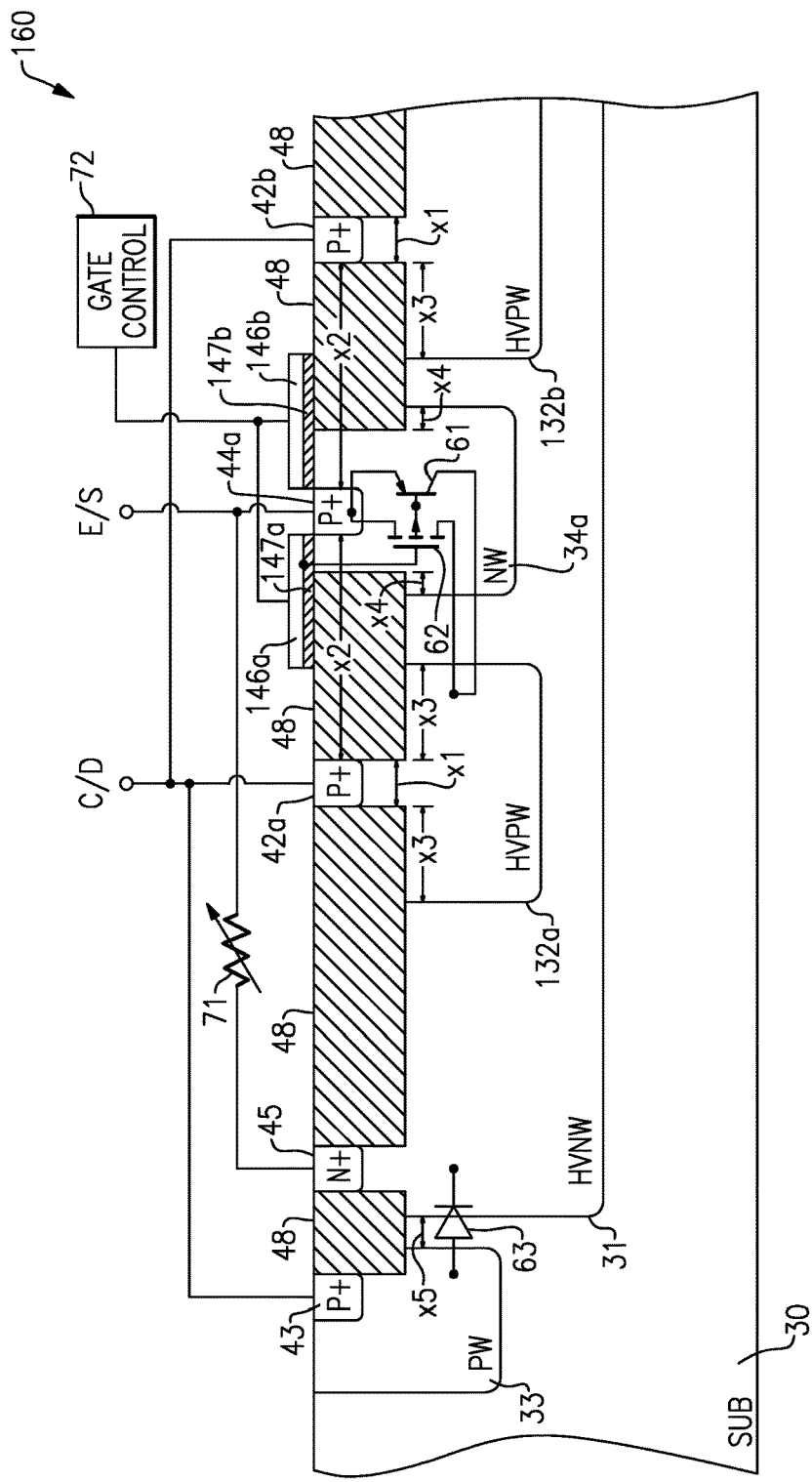
FIG. 6 is an annotated cross-section of a DEMOS bipolar switch according to another embodiment.

FIG. 6 is an annotated cross-section of a DEMOS bipolar clamp or switch 160 according to another embodiment. The DEMOS bipolar switch 160 of FIG. 6 is similar to the DEMOS bipolar switch 150 of FIG. 5, except that the DEMOS bipolar switch 160 further includes a variable resistor 71 and a gate control circuit 72.

The DEMOS bipolar switch 160 illustrates one example of a DEMOS switch incorporating a combination of features from two or more drawings. For example, the DEMOS switch 160 of FIG. 6 corresponds to the DEMOS switch 150 of FIG. 5 further including the variable resistor 71 of FIG. 3 and the gate control circuit 72 of FIG. 4A. Although one embodiment of a DEMOS switch incorporating a combination of features from multiple figures is shown, a DEMOS bipolar switch can include any suitable combination of features from two or more drawings.

Figure 7:
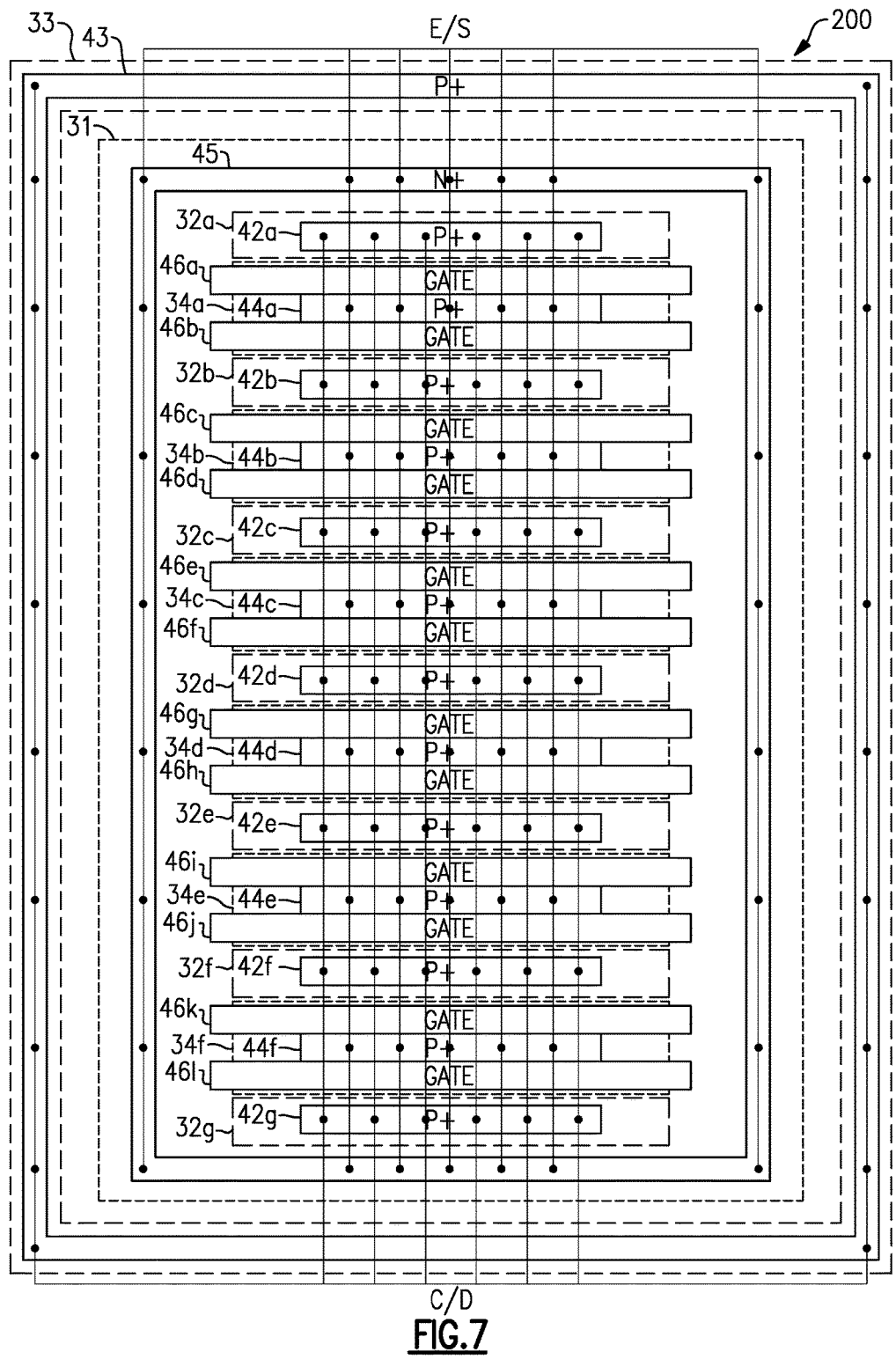
FIG. 7 is a top plan view of one embodiment of terminal metallization for the DEMOS bipolar switch of FIGS. 2A and 2B.

FIG. 7 is a top plan view 200 of one embodiment of terminal metallization for the DEMOS bipolar switch 60 of FIGS. 2A and 2B.

As shown in FIG. 7, an emitter/source (E/S) terminal is schematically depicted at a top of the figure, and a collector/source (C/S) terminal is schematically depicted at a bottom of the figure. Additionally, a first plurality of metal conductors extends from the emitter/source terminal and connects to the N+ ring 45 and the emitter/source P+ regions 44a-44f. Furthermore, a second plurality of metal conductors extends from the collector/drain terminal and connects to the collector/drain P+ regions 42a-42g and to the P+ ring 43. The first plurality of metal conductors and the second plurality of metal conductors are interleaved.

Although one example of a top plan view 200 of terminal metallization is shown in FIG. 7, other implementations are possible.

In the embodiments described above, the DEMOS bipolar switches includes layers, regions, and/or wells having n-type or p-type dopants. In other embodiments, the doping types of all the layers, regions, and wells of the blocking voltage devices can be opposite to those described and shown in the above embodiments, and the same principles and advantages can still apply to the other embodiments. For example, a complementary version of the DEMOS bipolar switches of FIGS. 2A-7 can be formed using an n-type substrate. In such embodiments, n-type wells and active regions are replaced with p-type wells and active regions, and p-type wells and active regions are replaced with n-type wells and active regions. Additionally, in such embodiments protection is provided by an n-type DEMOS (DENMOS) device and an embedded NPN bipolar device.

Thus, while illustrated in the context of a p-type semiconductor substrate, the principles and advantages described herein are also applicable to an n-type configuration where the doping polarities are reversed.

Figure 8A:
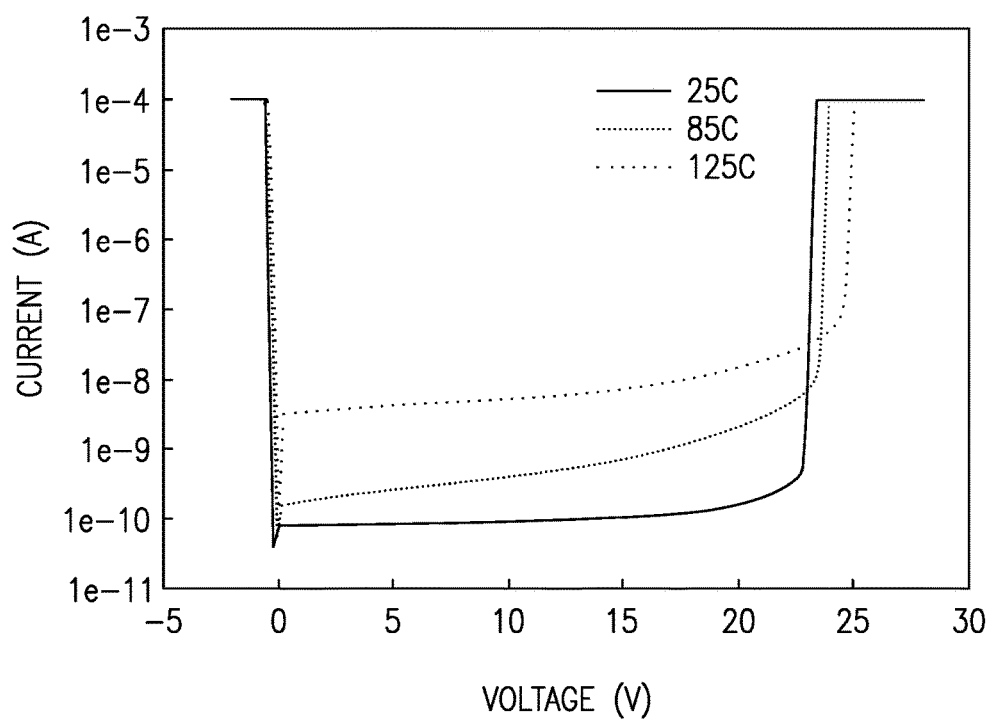
FIGS. 8A-8C illustrate DC characterization data for three examples of DEMOS bipolar switches.
Figure 8B:
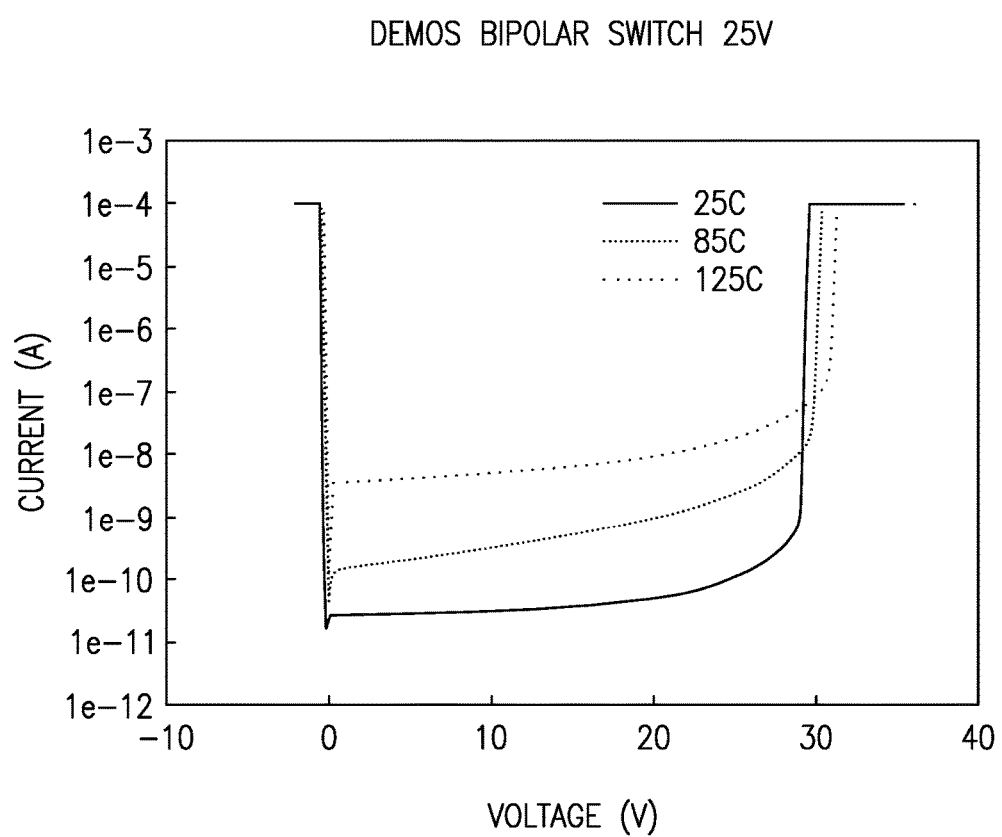
Figure 8C:
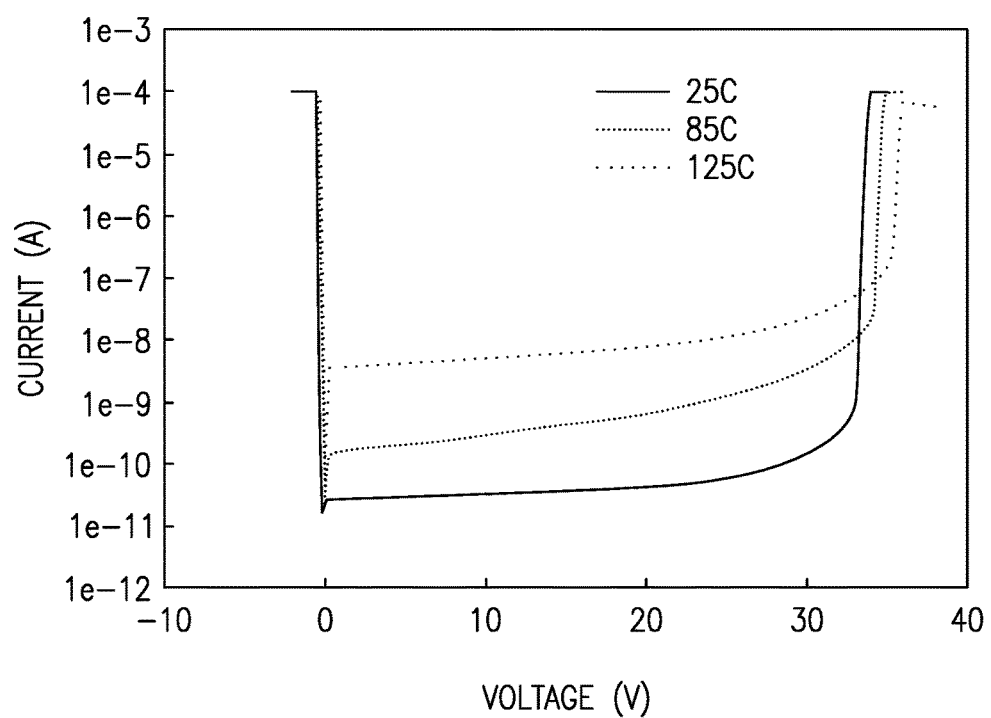

FIGS. 8A-8C illustrate DC characterization data for three examples of DEMOS bipolar switches. FIG. 8A is a graph of DC current versus DC voltage at three different temperatures for one implementation of the DEMOS bipolar switch of Table 1. FIG. 8B is a graph of DC current versus DC voltage at three different temperatures for one implementation of the DEMOS bipolar switch of Table 2. FIG. 8C is a graph of DC current versus DC voltage at three different temperatures for one implementation of the DEMOS bipolar switch of Table 3.

As shown by FIGS. 8A-8C, the forward trigger voltage of each DEMOS bipolar switch is relatively constant across changes in temperature. Additionally, the DEMOS bipolar switches provide robust bidirectional protection, with little to no snapback in response to forward stress.

Figure 9B:
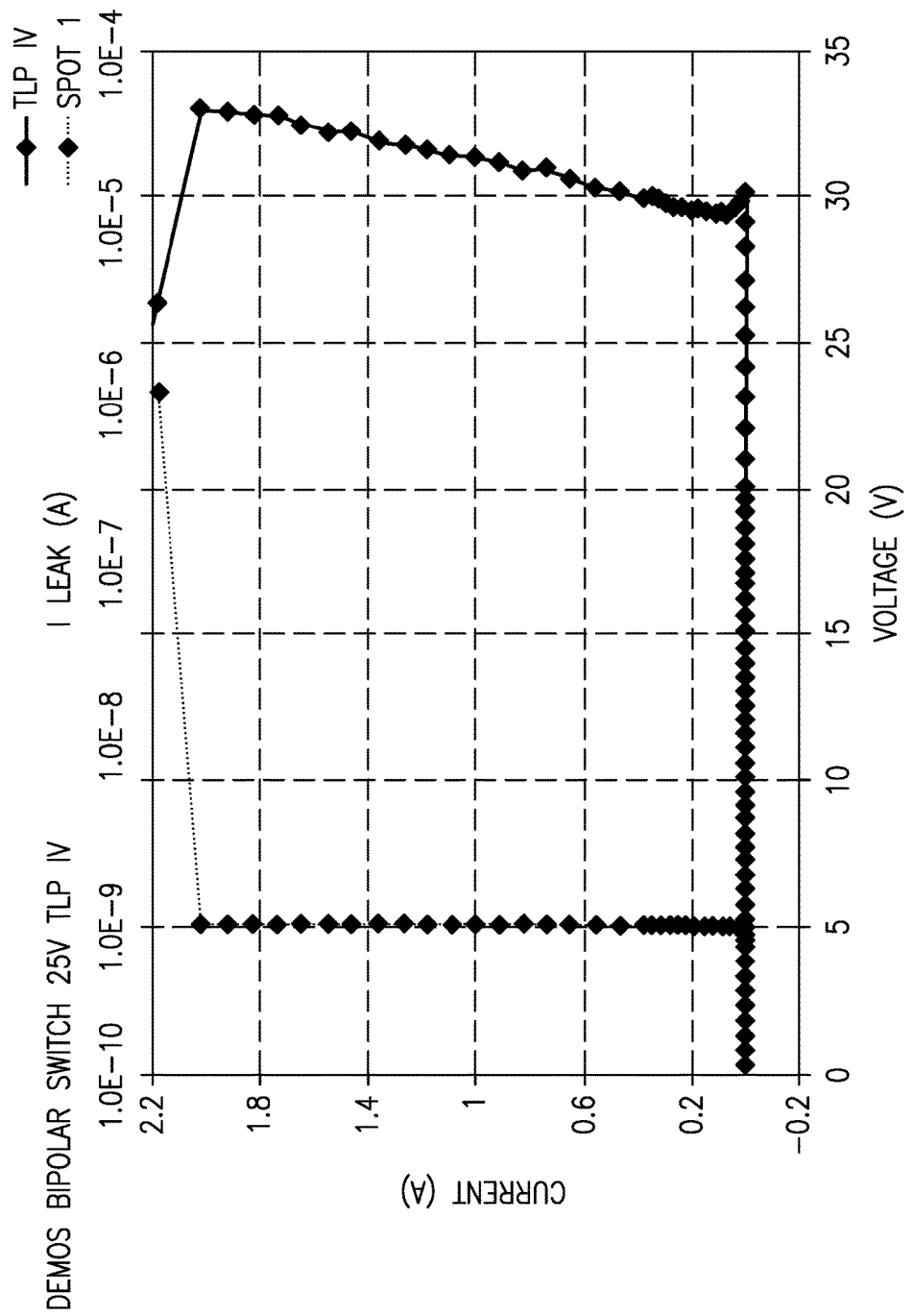
Figure 9C:
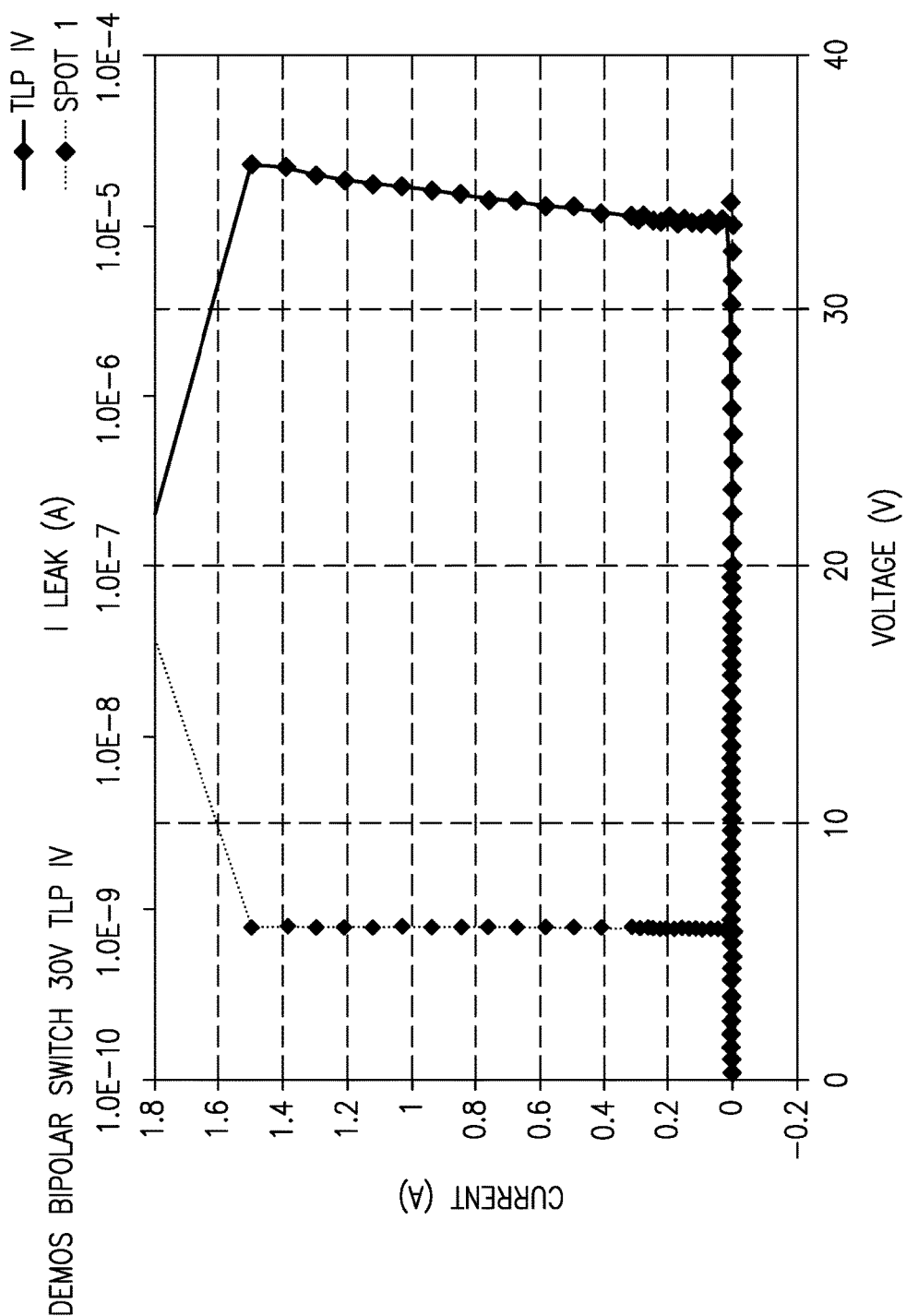

FIGS. 9A-9C illustrate transmission-line pulsing (TLP) data for three examples of DEMOS bipolar switches. FIG. 9A illustrates TLP data for one implementation of the DEMOS bipolar switch of Table 1. FIG. 9B illustrates TLP data for one implementation of the DEMOS bipolar switch of Table 2. FIG. 9C illustrates TLP data for one implementation of the DEMOS bipolar switch of Table 3.

TLP voltage is expressed along a first horizontal axis, leakage current is expressed along a second horizontal axis, and TLP current is expressed along a vertical axis. The TLP applies a pulse associated with a HBM (Human Body Model), and the current and voltage reading is captured in quasi-static conditions, as an average voltage and current reading corresponding to each data point. As skilled artisans will appreciate, a relatively small variation in the leakage current value after each pulse can indicate integrity of the IC, while drastic change in leakage current can indicate IC damage.

Figure 10A:
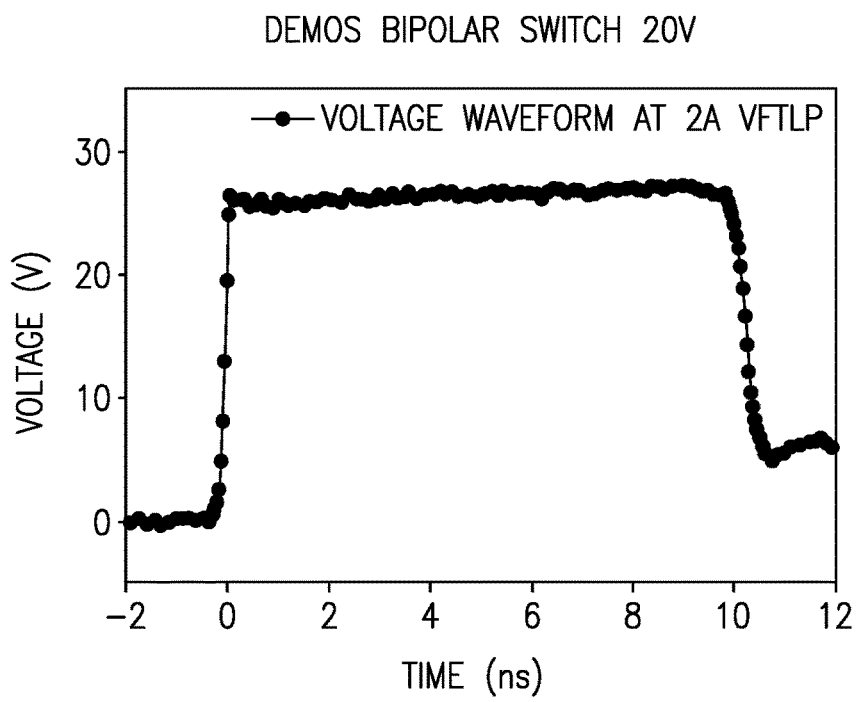
FIGS. 10A-10C illustrate transient waveform voltage for three examples of DEMOS bipolar switches.
Figure 10B:
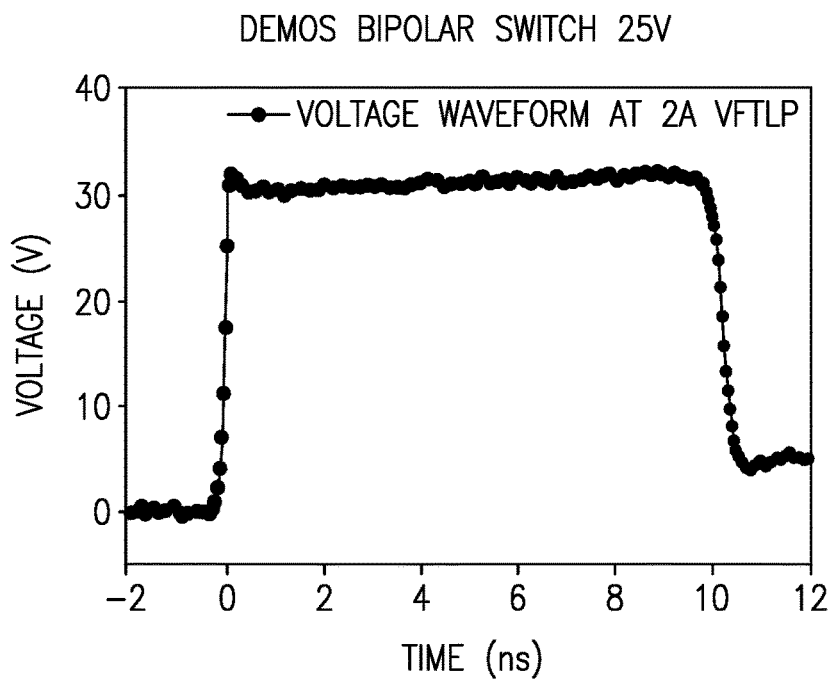
Figure 10C:
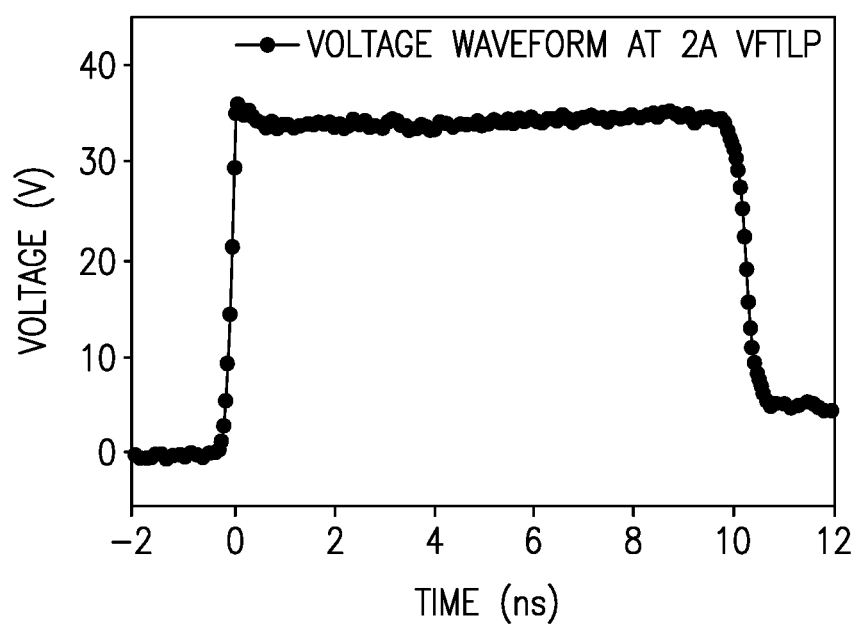

FIGS. 10A-10C illustrate transient waveform voltage for three examples of DEMOS bipolar switches. FIG. 10A illustrates a transient waveform voltage for one implementation of the DEMOS bipolar switch of Table 1. FIG. 10B illustrates a transient waveform voltage for one implementation of the DEMOS bipolar switch of Table 2. FIG. 10C illustrates a transient waveform voltage for one implementation of the DEMOS bipolar switch of Table 3.

The waveforms correspond to the voltage across the DEMOS bipolar switch in response to a 2 A current pulse applied at time 0 ns and ending at time 10 ns.

As shown in FIGS. 10A-10C, the DEMOS bipolar switches have a very fast activation time and a corresponding overshoot voltage that is very low.

Although FIGS. 8A-10C illustrate various measurement results of DEMOS bipolar switches, measurement data can vary with a wide variety of factors, including, but not limited to, design implementation, testing conditions, and/or fabrication process.

Applications

Devices employing the above described schemes can be implemented into various high performance electronic devices and interface applications operating in harsh electrical environments, such as interfaces associated with industrial, aeronautic, naval, energy harvesting, and/or automotive applications. Examples of the electronic devices can include, but are not limited to, consumer electronic products, parts of the consumer electronic products, electronic test equipment, high robustness industrial equipment, automotive equipment, etc. The consumer electronic products can include, but are not limited to, an automobile, an engine control unit, a vehicle engine management controller, a transmission controller, a seatbelt controller, an anti-lock brake system controller, etc. Further, the electronic device can include unfinished products, including those for industrial and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit (IC) comprising:
a substrate; and
an electrical overstress switch formed in the substrate and comprising a drain-extended metal-oxide-semiconductor (DEMOS) device and a bipolar device configured to clamp in response to an electrical overstress condition, wherein the electrical overstress switch further comprises:
a semiconductor region that operates as a base of the bipolar device;
an active region that operates as an emitter of the bipolar device and as a source of the DEMOS device, wherein the active region is formed in the semiconductor region and is of opposite doping type as the semiconductor region;
a well that operates as a collector of the bipolar device and as a drain of the DEMOS device, wherein the well is spaced apart from the active region in the semiconductor region, and is of common doping type as the active region;
a gate region that operates as a gate of the DEMOS device, wherein the gate region is formed over the semiconductor region and extends from an edge of the active region to an edge of the well; and
a well ring surrounding the semiconductor region and of opposite doping type as the semiconductor region, the well ring and the semiconductor region configured to operate as a reverse protection diode device.

2. The IC of claim 1, wherein the electrical overstress switch further comprises a gate oxide layer between the gate region and the semiconductor region, wherein a portion of the gate oxide layer adjacent to the drain of the DEMOS device is thicker than a portion of the gate oxide layer adjacent to the source of the DEMOS device.

3. The IC of claim 1, wherein the active region comprises a first p-type active (P+) region electrically connected to a first terminal via metallization, wherein the electrical overstress switch further comprises a second P+ region formed in the well and electrically connected to a second terminal via metallization.

4. The IC of claim 3, wherein the electrical overstress switch further comprises a field oxide region extending from the second P+ region to beneath a portion of the gate region.

5. The IC of claim 3, wherein the semiconductor region comprises a high voltage n-type well (HVNW) and an n-type well (NW) formed in the HVNW, wherein the NW is shallower and of higher n-type doping concentration than the HVNW.

6. The IC of claim 5, wherein NW is spaced apart from the well that operates as the collector of the bipolar device.

7. The IC of claim 5, wherein NW abuts the well that operates as the collector of the bipolar device.

8. The IC of claim 5, wherein the electrical overstress switch further comprises an n-type active (N+) ring in the HVNW and surrounding the NW and the well that operates as the collector of the bipolar device.

9. The IC of claim 8, wherein the electrical overstress switch further comprises a variable resistor electrically connected between the N+ ring and the first terminal, wherein an amount of resistance of the variable resistor controls a forward trigger voltage between the first terminal and the second terminal.

10. The IC of claim 5, wherein the well ring surrounding the semiconductor region comprises a p-type well (PW) ring surrounding the HVNW, wherein the PW ring operates as an anode of the reverse protection diode device, and the HVNW operates as a cathode of the reverse protection diode device.

11. The IC of claim 10, further comprising a P+ ring in the PW ring and electrically connected to the second terminal, and an N+ ring in the HVNW and electrically connected to the first terminal.

12. The IC of claim 3, wherein the electrical overstress switch has a forward holding voltage between the first terminal and the second terminal of at least 30 V, is operable to withstand at least about a 2,000 V human body model (HBM) electrical overstress event, and occupies an area of the substrate that is less than about 2,000 µm².

13. The IC of claim 1, wherein the electrical overstress switch further comprises a gate control circuit configured to control the gate region to turn on the DEMOS device in response to detecting an electrical overstress condition.

14. An electrical overstress switch for a high voltage interface, the electrical overstress switch comprising:
a first terminal;
a second terminal;
a bipolar device comprising an emitter formed from an active region, a base formed from a semiconductor region of opposite doping type as the active region, and a collector formed from a well of common doping type as the active region, wherein the active region is electrically connected to the first terminal, and the well is electrically connected to the second terminal;
an extended-drain metal oxide semiconductor (DEMOS) device comprising a drain formed from the well, a source formed from the active region, a body formed from the semiconductor region, and a gate formed from a gate region,
wherein the gate region is formed over a field oxide region and the semiconductor region, and extends from an edge of the active region to an edge of the well; and
a well ring surrounding the semiconductor region and of opposite doping type as the semiconductor region, the well ring and the semiconductor region configured to operate as a reverse protection diode device.

15. The electrical overstress switch of claim 14, wherein the active region comprises a first p-type active (P+) region electrically connected to the first terminal via metallization, wherein the electrical overstress switch further comprises a second P+ region formed in the well and electrically connected to the second terminal via metallization.

16. The electrical overstress switch of claim 15, wherein the field oxide region extends from the second P+ region to beneath a portion of the gate region.

17. A system-on-a-package (SoP) comprising:
a package substrate; and
a system-on-a-chip (SoC) attached to the package substrate and configured to receive a high voltage supply and ground, wherein the SoC comprises:
a high voltage interface circuit powered by the high voltage supply and ground; and
an electrical overstress switch comprising an extended-drain metal oxide semiconductor (DEMOS) device and a bipolar device configured to protect the high voltage interface circuit from electrical overstress, wherein the bipolar device comprises an emitter formed from an active region, a base formed from a semiconductor region of opposite doping type as the active region, and a collector formed from a well of common doping type as the active region, wherein the DEMOS device comprises a drain formed from the well, a source formed from the active region, a body formed from the semiconductor region, and a gate formed over a field oxide region and the semiconductor region, and extending from an edge of the active region to an edge of the well, the electrical overstress switch further comprising a well ring surrounding the semiconductor region and of opposite doping type as the semiconductor region, the well ring and the semiconductor region configured to operate as a reverse protection diode device.

18. The SoP of claim 17, wherein the active region comprises a first p-type active (P+) region electrically connected to the high voltage supply via metallization, wherein the electrical overstress switch further comprises a second P+ region formed in the well and electrically connected to ground via metallization.

19. The SoP of claim 18, wherein the field oxide region extends from the second P+ region to beneath a portion of the gate region.

20. The SoP of claim 18, further comprising one or more sensors attached to the package substrate, wherein the high voltage interface is operable to handle at least one sensor signal associated with the one or more sensors.

* * * * *